(12) United States Patent
Nakatani et al.

(10) Patent No.: US 12,217,959 B2
(45) Date of Patent: *Feb. 4, 2025

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Kimihiko Nakatani, Toyama (JP); Tsukasa Kamakura, Toyama (JP); Hajime Karasawa, Toyama (JP); Kazuhiro Harada, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 293 days.

This patent is subject to a terminal disclaimer.

(21) Appl. No.: 16/115,179

(22) Filed: Aug. 28, 2018

(65) Prior Publication Data

US 2018/0363138 A1 Dec. 20, 2018

Related U.S. Application Data

(63) Continuation of application No. PCT/JP2016/056067, filed on Feb. 29, 2016.

(51) Int. Cl.
*C23C 16/30* (2006.01)
*C23C 16/32* (2006.01)
(Continued)

(52) U.S. Cl.
CPC ........ *H01L 21/02532* (2013.01); *C23C 16/30* (2013.01); *C23C 16/325* (2013.01);
(Continued)

(58) Field of Classification Search
None
See application file for complete search history.

(56) References Cited

U.S. PATENT DOCUMENTS 6,372,558 B1 4/2002 Yamanaka et al.
7,300,885 B2 11/2007 Hasebe et al.
(Continued)

FOREIGN PATENT DOCUMENTS

CN 1502124 A 6/2004
CN 101135046 A 3/2008
(Continued)

OTHER PUBLICATIONS

Junold [Bis[N, N'-diisopropylbenzamidinato(-)]silicon(II): Lewis acid/base reactions with triorganylboranes] , Aug. 11, 2014, ChemPubSoc Europe (Year: 2014).*

(Continued)

*Primary Examiner* — Mandy C Louie
(74) *Attorney, Agent, or Firm* — Volpe Koenig

(57) ABSTRACT

There is provided a technique that includes: forming a film on a substrate by performing, simultaneously at least for a predetermined period: supplying a first precursor to the substrate, the first precursor containing a chemical bond of a predetermined element and nitrogen or a chemical bond of the predetermined element and carbon, containing a chemical bond of the predetermined element and hydrogen, and not containing a chemical bond of nitrogen and hydrogen; and supplying a pseudo catalyst to the substrate, the pseudo catalyst containing a Group 13 element and not containing the chemical bond of nitrogen and hydrogen, wherein in the act of forming the film, a substance containing the chemical bond of nitrogen and hydrogen is not supplied to the substrate.

8 Claims, 10 Drawing Sheets

(51) Int. Cl.

| | |
|---|---|
| *C23C 16/36* | (2006.01) |
| *C23C 16/455* | (2006.01) |
| *C23C 16/458* | (2006.01) |
| *C23C 16/52* | (2006.01) |
| *H01L 21/02* | (2006.01) |
| *H01L 21/033* | (2006.01) |
| *H01L 21/31* | (2006.01) |

(52) U.S. Cl.
CPC ........ *C23C 16/36* (2013.01); *C23C 16/45523* (2013.01); *C23C 16/45565* (2013.01); *C23C 16/45578* (2013.01); *C23C 16/4584* (2013.01); *C23C 16/52* (2013.01); *H01L 21/02167* (2013.01); *H01L 21/02211* (2013.01); *H01L 21/02219* (2013.01); *H01L 21/02277* (2013.01); *H01L 21/02573* (2013.01); *H01L 21/0262* (2013.01); *H01L 21/0332* (2013.01); *H01L 21/31* (2013.01); *H01L 21/02529* (2013.01)

(56) References Cited

U.S. PATENT DOCUMENTS

| | | |
|---|---|---|
| 2002/0121676 A1 | 9/2002 | Chu et al. |
| 2006/0032443 A1 | 2/2006 | Hasebe et al. |
| 2006/0205231 A1 | 9/2006 | Chou et al. |
| 2006/0286817 A1 | 12/2006 | Kato et al. |
| 2008/0063791 A1 | 3/2008 | Hasebe et al. |
| 2009/0181550 A1 | 7/2009 | Hasebe et al. |
| 2010/0151682 A1 | 6/2010 | Moriya et al. |
| 2010/0240217 A1 | 9/2010 | Kushibiki et al. |
| 2011/0135557 A1 | 6/2011 | Rangarajan et al. |
| 2011/0263105 A1 | 10/2011 | Hasebe et al. |
| 2011/0269315 A1 | 11/2011 | Hasebe et al. |
| 2012/0321791 A1 | 12/2012 | Suzuki et al. |
| 2012/0329286 A1 | 12/2012 | Takeda et al. |
| 2013/0102132 A1 | 4/2013 | Takeda |
| 2013/0109155 A1 | 5/2013 | Okada et al. |
| 2013/0149872 A1 | 6/2013 | Hirose et al. |
| 2013/0149873 A1 | 6/2013 | Hirose et al. |
| 2013/0237064 A1 | 9/2013 | Kirikihira et al. |
| 2013/0280921 A1 | 10/2013 | Takeda et al. |
| 2014/0256156 A1* | 9/2014 | Harada ............... C23C 16/0272 118/704 |
| 2014/0264555 A1 | 9/2014 | Ahn et al. |
| 2015/0004317 A1 | 1/2015 | Dussarrat et al. |
| 2015/0228474 A1 | 8/2015 | Hanashima et al. |
| 2015/0357181 A1 | 12/2015 | Yamamoto et al. |
| 2016/0005839 A1* | 1/2016 | Yieh .................... H01L 21/266 438/506 |
| 2016/0013042 A1 | 1/2016 | Hashimoto et al. |
| 2016/0155627 A1 | 6/2016 | Hanashima et al. |
| 2016/0196970 A1 | 7/2016 | Takamure et al. |
| 2016/0233085 A1 | 8/2016 | Yamaguchi et al. |
| 2016/0314962 A1 | 10/2016 | Higashino et al. |
| 2017/0011908 A1 | 1/2017 | Matsuoka et al. |
| 2017/0025271 A1 | 1/2017 | Hashimoto et al. |
| 2017/0040157 A1 | 2/2017 | Hashimoto et al. |
| 2017/0263439 A1 | 9/2017 | Hashimoto et al. |
| 2018/0280950 A1* | 10/2018 | Fontaine ................. B01J 31/22 |
| 2018/0355483 A1* | 12/2018 | Kuchenbeiser ......... C23C 16/30 |
| 2020/0032389 A1* | 1/2020 | Lei .......................... C23C 16/24 |

FOREIGN PATENT DOCUMENTS

| | | |
|---|---|---|
| JP | 2006-270016 A | 10/2006 |
| JP | 2006-287194 A | 10/2006 |
| JP | 2008-060455 A | 3/2008 |
| JP | 2008-153684 A | 7/2008 |
| JP | 2010-141223 A | 6/2010 |
| JP | 2010-219105 A | 9/2010 |
| JP | 2011-139033 A | 7/2011 |
| JP | 2011254063 A | 12/2011 |
| JP | 2012-142482 A | 7/2012 |
| JP | 2012-186275 A | 9/2012 |
| JP | 2013-021301 A | 1/2013 |
| JP | 2013-030752 A | 2/2013 |
| JP | 2013-095945 A | 5/2013 |
| JP | 2013-102130 A | 5/2013 |
| JP | 2013-191770 A | 9/2013 |
| JP | 2014-093331 A | 5/2014 |
| JP | 2014-222777 A | 11/2014 |
| JP | 2015-525773 A | 9/2015 |
| JP | 2015-183260 A | 10/2015 |
| JP | 2015-185614 A | 10/2015 |
| KR | 2016-0006631 A | 1/2016 |
| TW | 201330060 A | 7/2013 |
| WO | WO-2004094695 A2 * | 11/2004 ....... C23C 16/45525 |
| WO | 2015/045099 A1 | 4/2015 |

OTHER PUBLICATIONS

Keess et al. "Direct and transfer hydrosilylation reactions catalyzed by fully or partially fluorinated triarylboranes: a systematic study" Organometallics 2015 34 p. 790-799 (Year: 2015).*
Japanese Office Action issued on Nov. 6, 2018 for the Japanese Patent Application No. 2018-502871.
Korean Office Action dated Aug. 21, 2019 for the Korean Patent Application No. 10-2018-7024299.
International Preliminary Report on Patentability issued on Apr. 7, 2016 for the International Patent Application No. PCT/JP2013/076273.
International Search Report issued on Dec. 17, 2013 for the International Patent Application No. PCT/JP2013/076273.
Korean Office Action issued on Jul. 30, 2018 for the Korean Patent Application No. 10-2017-0093347.
Korean Office Action issued on Feb. 27, 2019 for the Korean Patent Application No. 10-2017-0093347.
Japanese Office Action issued on May 28, 2019 for the Japanese Patent Application No. 2016-146506.
International Search Report issued May 31, 2016 of PCT International Application No. PCT/JP2016/056067.
Chinese Office Action issued on Mar. 15, 2022 for Chinese Patent Application No. 201680079075.0.

* cited by examiner

FIG. 8A

| | C1 | C2 | C3 | C4 | C5 | C6 | C7 | C8 |
|---|---|---|---|---|---|---|---|---|
| Film-forming temperature (°C) | 315~335 | 315~335 | 340~360 | 315~335 | 315~335 | 315~335 | 290~310 | 315~335 |
| Film-forming pressure (Pa) | 50~70 | 170~190 | 50~70 | 50~70 | 50~70 | 50~70 | 170~190 | 50~70 |
| TSA flow rate (sccm) | 10~20 | 10~20 | 10~20 | 40~50 | 10~20 | 40~50 | 40~50 | 10~20 |
| DS flow rate (sccm) | 0 | 0 | 0 | 0 | 20~40 | 80~100 | 80~90 | 0 |
| TEB flow rate (sccm) | 3~10 | 3~10 | 3~10 | 3~10 | 3~10 | 3~10 | 3~10 | 3~10 |
| NH₃ flow rate (sccm) | 0 | 0 | 0 | 0 | 0 | 0 | 0 | 250~350 |

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION(S)

This application is a Bypass Continuation Application of PCT International Application No. PCT/JP2016/056067, filed on Feb. 29, 2016, the entire contents of which are incorporated herein by reference.

TECHNICAL FIELD

The present disclosure relates to a method of manufacturing a semiconductor device, a substrate processing apparatus, and a recording medium.

BACKGROUND

As one of the processes of manufacturing a semiconductor device, a process of forming a film on a substrate may be performed in some cases.

SUMMARY

The present disclosure provides some embodiments of a technique capable of improving the controllability of a composition ratio of a film formed on a substrate.

According to one embodiment of the present disclosure, there is provided a technique that includes: forming a film on a substrate by performing, simultaneously at least for a predetermined period: supplying a first precursor to the substrate, the first precursor containing a chemical bond of a predetermined element and nitrogen or a chemical bond of the predetermined element and carbon, containing a chemical bond of the predetermined element and hydrogen, and not containing a chemical bond of nitrogen and hydrogen; and supplying a pseudo catalyst to the substrate, the pseudo catalyst containing a Group 13 element and not containing the chemical bond of nitrogen and hydrogen, wherein in the act of forming the film, a substance containing the chemical bond of nitrogen and hydrogen is not supplied to the substrate.

BRIEF DESCRIPTION OF THE DRAWINGS

FIG. 8A is a diagram showing processing conditions at the time of film formation.

DETAILED DESCRIPTION

One Embodiment of the Present Disclosure

One embodiment of the present disclosure will now be described with reference to FIGS. 1 to 3.

(1) Configuration of Substrate Processing Apparatus

Figure 1:
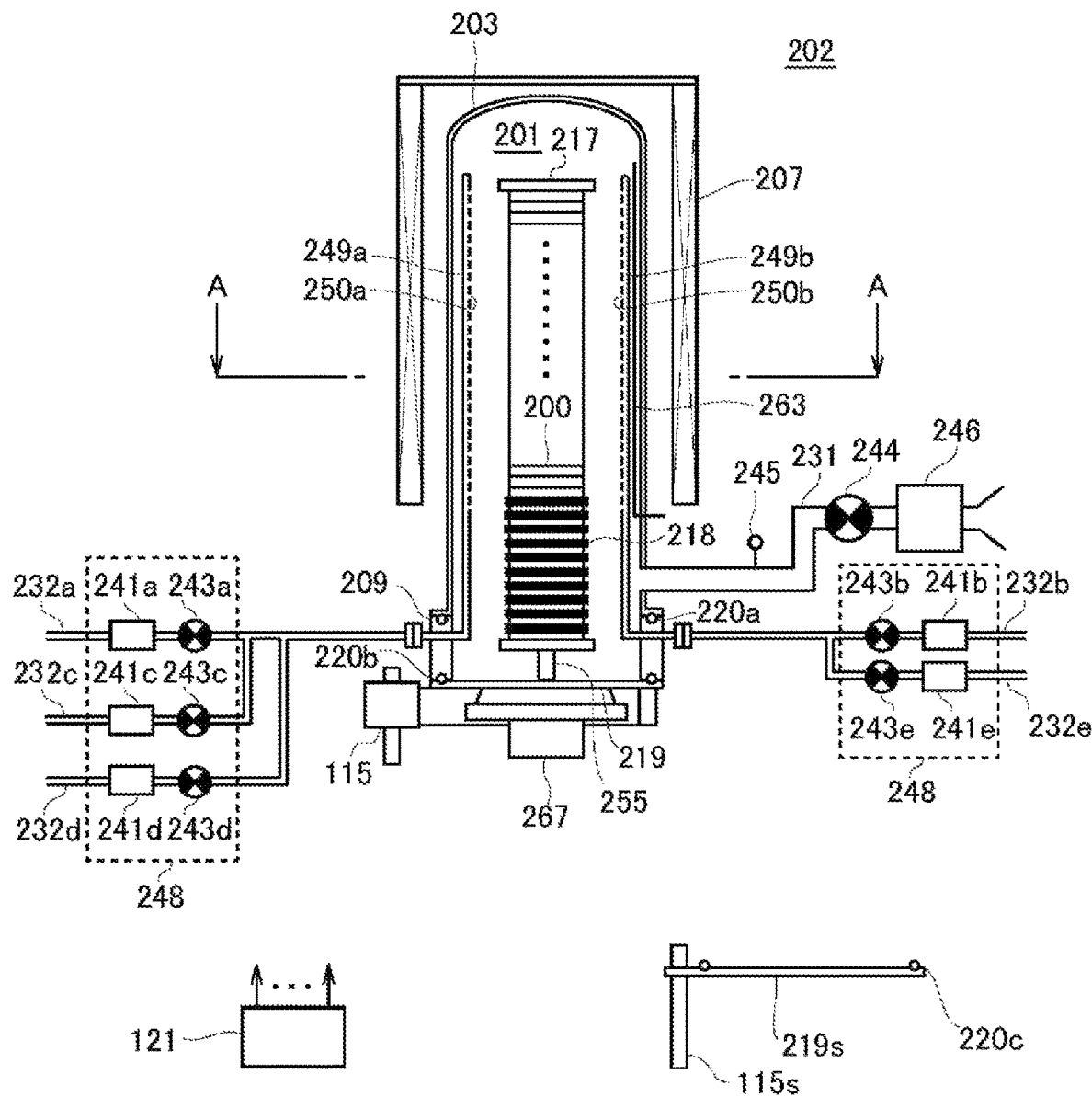
FIG. 1 is a schematic configuration view of a vertical process furnace of a substrate processing apparatus suitably used in an embodiment of the present disclosure, in which a portion of the process furnace is shown in a vertical cross section.
Figure 2:
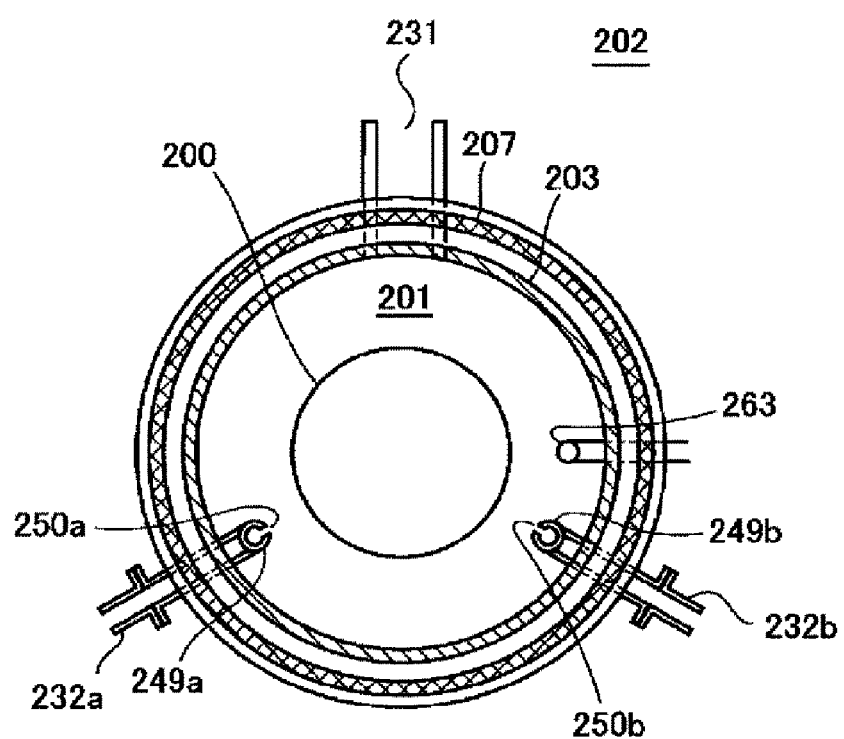
FIG. 2 is a schematic configuration view of a portion of a vertical process furnace of a substrate processing apparatus suitably used in an embodiment of the present disclosure, in which a portion of the process furnace is shown as a sectional view taken along line A-A in FIG. 1.

As illustrated in FIG. 1, a process furnace 202 includes a heater 207 as a heating mechanism (temperature adjustment part). The heater 207 has a cylindrical shape and is supported by a holding plate so as to be vertically installed. The heater 207 also functions as an activation mechanism (an excitation part) configured to thermally activate (excite) a gas.

A reaction tube 203 is disposed inside the heater 207 in a concentric relationship with the heater 207. The reaction tube 203 is made of a heat resistant material such as, e.g., quartz ($SiO_2$), silicon carbide (SiC) or the like and has a cylindrical shape with its upper end closed and its lower end opened. A manifold (inlet flange) 209 is disposed below the reaction tube 203 in a concentric relationship with the reaction tube 203. The manifold 209 is made of metal, e.g., stainless steel (SUS), and has a cylindrical shape with its upper and lower ends opened. The upper end of the manifold 209 engages with the lower end of the reaction tube 203 so that the manifold 209 is configured to support the reaction tube 203. An O-ring 220a as a seal member is provided between the manifold 209 and the reaction tube 203. The reaction tube 203 is vertically installed just like the heater 207. A process container (reaction container) mainly includes the reaction tube 203 and the manifold 209. A process chamber 201 is formed in a hollow cylindrical portion of the process container. The process chamber 201 is configured to accommodate wafers 200 as a plurality of substrates.

In the process chamber 201, nozzles 249a and 249b are installed so as to penetrate the side wall of the manifold 209. Gas supply pipes 232a and 232b are connected to the nozzles 249a and 249b, respectively. A gas supply pipe 232c is connected to the gas supply pipe 232a.

Mass flow controllers (MFCs) 241a to 241c, which are flow rate controllers (flow rate control parts), and valves 243a to 243c, which are opening/closing valves, are sequentially installed in the gas supply pipes 232a to 232c, respectively, from the upstream sides of gas flows. Gas supply pipes 232d and 232e, which supply an inert gas, are connected to the gas supply pipes 232a and 232b on the downstream side of the valves 243a and 243b, respectively.

MFCs 241*d* and 241*e* and valves 243*d* and 243*e* are sequentially installed in the gas supply pipes 232*d* and 232*e*, respectively, from the upstream sides of gas flows.

The nozzles 249*a* and 249*b* are connected to front end portions of the gas supply pipes 232*a* and 232*b*, respectively. As illustrated in FIG. 2, the nozzles 249*a* and 249*b* are respectively disposed in a space with an annular plan-view shape between the inner wall of the reaction tube 203 and the wafers 200 such that the nozzles 249*a* and 249*b* extend upward along a stacking direction of the wafers 200 from a lower portion of the inner wall of the reaction tube 203 to an upper portion thereof. Specifically, the nozzles 249*a* and 249*b* are respectively installed on a lateral side of a wafer arrangement region in which the wafers 200 are arranged, namely in a region which horizontally surrounds the wafer arrangement region, so as to extend along the wafer arrangement region. The nozzles 249*a* and 249*b* are respectively configured as L-shaped long nozzles. Gas supply holes 250*a* and 250*b* for supplying a gas are formed on the side surfaces of the nozzles 249*a* and 249*b*, respectively. The gas supply holes 250*a* and 250*b* are opened toward the center of the reaction tube 203 and are capable of supplying a gas toward the wafers 200. The gas supply holes 250*a* and 250*b* may be formed in a plural number between the lower portion of the reaction tube 203 and the upper portion thereof. The respective gas supply holes 250*a* and 250*b* may have the same aperture area and may be formed at the same aperture pitch.

As described above, in the present embodiment, a gas is transferred through the nozzles 249*a* and 249*b*, which are disposed in a vertically-elongated space with an annular plan-view shape, i.e., a cylindrical space, defined by the inner surface of the side wall of the reaction tube 203 and the end portions (peripheral edge portions) of the wafers 200 arranged inside the reaction tube 203. The gas is initially injected into the reaction tube 203, near the wafers 200, through the gas supply holes 250*a* and 250*b* formed in the nozzles 249*a* and 249*b*. Accordingly, the gas supplied into the reaction tube 203 mainly flows in the reaction tube 203 in a direction parallel to the surfaces of the wafers 200, i.e., in a horizontal direction. With this configuration, the gas may be uniformly supplied to the respective wafers 200. The gas flowing on the surfaces of the wafers 200 flows toward an exhaust port, i.e., the exhaust pipe 231 which will be described later. The flow direction of the gas is not limited to the vertical direction but may be appropriately decided depending on the position of the exhaust port.

Figure 5A:
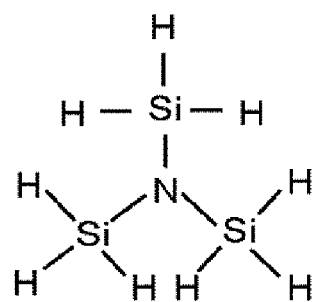
FIGS. 5A to 5C are diagrams showing the chemical structural formulae of TSA, TEB and DS, respectively.

From the gas supply pipe 232*a*, a first precursor containing a chemical bond (Si—N bond) of silicon (Si) as a predetermined element (main element) and nitrogen (N) or a chemical bond (Si—C bond) of Si and carbon (C), containing a chemical bond (Si—H bond) of Si and hydrogen (H), and not containing a chemical bond (N—H bond) of N and H is supplied into the process chamber 201 via the MFC 241*a*, the valve 243*a* and the nozzle 249*a*. As the first precursor, for example, a trisilylamine (N(SiH$_3$)$_3$, abbreviation: TSA) gas may be used. As shown as a chemical structural formula in FIG. 5A, TSA is a substance containing Si—N bonds and Si—H bonds. TSA contains three Si—N bonds and nine Si—H bonds in one molecule. Three Si atoms are bonded to one N atom (central element) in TSA. TSA also acts as a Si source and also as an N source in a film-forming process to be described later.

Figure 5B:
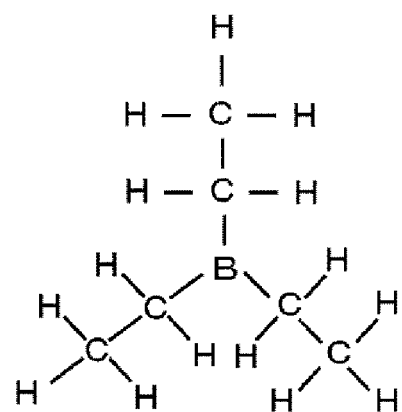

From the gas supply pipe 232*b*, a pseudo catalyst containing boron (B) as a group 13 (group III) element and not containing an N—H bond is supplied into the process chamber 201 via the MFC 241*b*, the valve 243*b* and the nozzle 249*b*. As used herein, the term "catalyst" refers to a substance that does not change itself before and after a chemical reaction but changes a reaction rate. On the other hand, a pseudo catalyst used in a reaction system of the present embodiment changes a reaction rate and the like as described later, and is at least partially changed before and after a chemical reaction. In other words, the pseudo catalyst in the reaction system of the present embodiment acts as a catalyst but is not a "catalyst" in a strict sense. In this specification, a substance acting like a catalyst and at least partially changed before and after a chemical reaction is called a "pseudo catalyst". As the pseudo catalyst, for example, a triethylborane (B(C$_2$H$_5$)$_3$, abbreviation: TEB) gas may be used. As shown as a chemical structural formula in FIG. 5B, TEB is a substance containing a B—C bond, a C—H bond and a C—C bond. TEB contains three B—C bonds, fifteen C—H bonds and three C—C bonds in one molecule. Three C atoms are bonded to one B atom (central element) in TEB. TEB acts not only as a catalyst but also as a B source and a C source in a film-forming process to be described later.

Figure 5C:
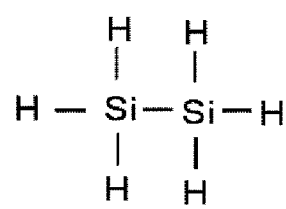

From the gas supply pipe 232*c*, a second precursor differing in molecular structure (chemical structure) from the first precursor, containing a Si—H bond and not containing an N—H bond is supplied into the process chamber 201 via the MFC 241*c*, the valve 243*c*, the gas supply pipe 232*a* and the nozzle 249*a*. As the second precursor, for example, a disilane (Si$_2$H$_6$, abbreviation: DS) gas may be used. As shown as a chemical structural formula in FIG. 5C, DS is a substance containing a Si—H bond and a Si—Si bond, and acts as a Si source in a film-forming process to be described later.

From the gas supply pipes 232*d* and 232*e*, for example, a nitrogen (N$_2$) gas as an inert gas is supplied into the process chamber 201 via the MFCs 241*d* and 241*e*, the valves 243*d* and 243*e*, the gas supply pipes 232*a* and 232*b*, and the nozzles 249*a* and 249*b*.

A first precursor supply system mainly includes the gas supply pipe 232*a*, the MFC 241*a* and the valve 243*a*. A second precursor supply system mainly includes the gas supply pipe 232*c*, the MFC 241*c* and the valve 243*c*. A pseudo catalyst supply system mainly includes the gas supply pipe 232*b*, the MFC 241*b* and the valve 243*b*. An inert gas supply system mainly includes the gas supply pipes 232*d* and 232*e*, the MFCs 241*d* and 241*e* and the valves 243*d* and 243*e*.

Either or all of the above-described various supply systems may be configured as an integrated supply system 248 in which the valves 243*a* to 243*e*, the MFCs 241*a* to 241*e* and the like are integrated. The integrated supply system 248 is connected to each of the gas supply pipes 232*a* to 232*e* and is configured so that the operation of supplying various gases into the gas supply pipes 232*a* to 232*e*, i.e., the opening/closing operation of the valves 243*a* to 243*e*, the flow rate adjustment operation by the MFCs 241*a* to 241*e*, and the like are controlled by a controller 121 which will be described later. The integrated supply system 248 is configured as a one-piece type integrated unit or a split type integrated unit and may be attached to and detached from the gas supply pipes 232*a* to 232*e* or the like on an integrated unit basis. The integrated supply system 248 is configured so that the maintenance, replacement, expansion or the like of the supply system can be performed on an integrated unit basis.

An exhaust pipe 231 configured to exhaust the internal atmosphere of the process chamber 201 is installed in the reaction tube 203. A vacuum pump 246 as a vacuum exhaust device is connected to the exhaust pipe 231 via a pressure sensor 245 as a pressure detector (pressure detection part), which detects the pressure inside the process chamber 201 and an auto pressure controller (APC) valve 244 as a pressure regulator (pressure regulation part). The APC valve 244 is configured so that the vacuum exhaust and the vacuum exhaust stop of the interior of the process chamber 201 can be performed by opening and closing the APC valve 244 while operating the vacuum pump 246 and so that the pressure inside the process chamber 201 can be regulated by adjusting the opening degree of the APC valve 244 based on the pressure information detected by the pressure sensor 245 while operating the vacuum pump 246. An exhaust system mainly includes the exhaust pipe 231, the APC valve 244 and the pressure sensor 245. The vacuum pump 246 may be included in the exhaust system.

A seal cap 219, which serves as a furnace opening cover configured to hermetically seal a lower end opening of the manifold 209, is installed under the manifold 209. The seal cap 219 is made of metal such as, e.g., stainless steel or the like, and is formed in a disc shape. An O-ring 220*b*, which is a seal member making contact with the lower end portion of the manifold 209, is provided on an upper surface of the seal cap 219. A rotation mechanism 267 configured to rotate a boat 217, which will be described later, is installed under the seal cap 219. A rotation shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism installed outside the reaction tube 203. The boat elevator 215 is configured to load and unload the boat 217 into and from the process chamber 201 by moving the seal cap 219 up and down. The boat elevator 115 is configured as a transfer device (transfer mechanism) which transfers the boat 217, i.e., the wafers 200, into and out of the process chamber 201. Furthermore, a shutter 219*s* as a furnace opening cover, which is capable of hermetically sealing the lower end opening of the manifold 209 while lowering the seal cap 219 by the boat elevator 115, is installed under the manifold 209. The shutter 219*s* is made of metal such as, e.g., stainless steel or the like, and is formed in a disc shape. An O-ring 220*c* as a seal member making contact with the lower end portion of the manifold 209 is installed on an upper surface of the shutter 219*s*. An opening/closing operation (a vertical movement operation or a rotational movement operation) of the shutter 219*s* is controlled by a shutter opening/closing mechanism 115*s*.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is to say, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed below the boat 217 in multiple stages. With this configuration, the heat generated from the heater 207 is less likely to be transferred to the seal cap 219. Instead of installing the heat insulating plates 218, a heat insulating cylinder as a cylindrical member made of a heat resistant material such as quartz or SiC may be provided under the boat 217.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. Similar to the nozzles 249*a* and 249*b*, the temperature sensor 263 is formed in an L shape. The temperature sensor 263 is installed along the inner wall of the reaction tube 203.

Figure 3:
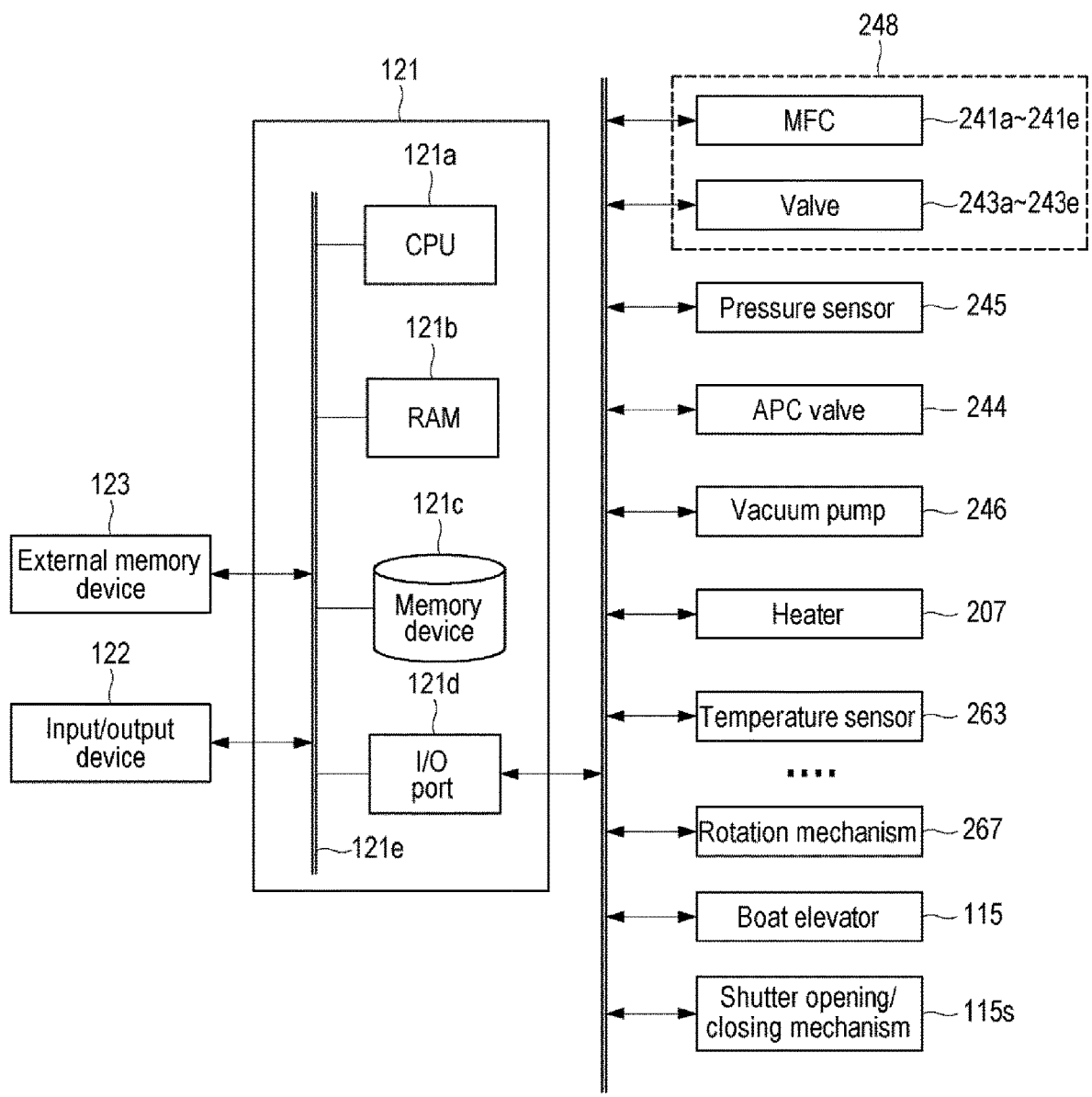
FIG. 3 is a schematic configuration view of a controller of a substrate processing apparatus suitably used in an embodiment of the present disclosure, in which a control system of a controller is shown as a block diagram.

As illustrated in FIG. 3, a controller 121, which is a control part (control means), may be configured as a computer including a central processing unit (CPU) 121*a*, a random access memory (RAM) 121*b*, a memory device 121*c*, and an I/O port 121*d*. The RAM 121*b*, the memory device 121*c* and the I/O port 121*d* are configured to exchange data with the CPU 121*a* via an internal bus 121*e*. An input/output device 122 formed of a touch panel or the like is connected to the controller 121.

The memory device 121*c* includes a flash memory, a hard disc drive (HDD), or the like. A control program for controlling operations of a substrate processing apparatus, or a process recipe, in which sequences and conditions of a film-forming process to be described later are written, are readably stored in the memory device 121*c*. The process recipe functions as a program for causing the controller 121 to execute each sequence in the film-forming process, which will be described later, to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 121*b* is configured as a memory area (work area) in which a program or data read by the CPU 121*a* is temporarily stored.

The I/O port 121*d* is connected to the MFCs 241*a* to 241*e*, the valves 243*a* to 243*e*, the pressure sensor 245, the APC valve 244, the vacuum pump 246, the temperature sensor 263, the heater 207, the rotation mechanism 267, the boat elevator 115, the shutter opening/closing mechanism 115*s*, and the like.

The CPU 121*a* is configured to read the control program from the memory device 121*c* and execute the same. The CPU 121*a* also reads the recipe from the memory device 121*c* according to an input of an operation command from the input/output device 122. In addition, the CPU 121*a* is configured to control, according to the contents of the recipe thus read, the flow rate adjusting operation of various kinds of gases by the MFCs 241*a* to 241*e*, the opening/closing operation of the valves 243*a* to 243*e*, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, the operation of opening and closing the shutter 219*s* with the shutter opening/closing mechanism 115*s*, and the like.

The controller 121 may be configured by installing, on the computer, the aforementioned program stored in an external memory device 123 (for example, a magnetic disc such as a hard disc or the like, an optical disc such as a CD or a DVD, a magneto-optical disc such as an MO, or a semiconductor memory such as a USB memory or the like). The memory device 121*c* or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using a communication means such as the Internet or a dedicated line, instead of using the external memory device 123.

(2) Film-Forming Process

A sequence example of forming a film on a substrate using the aforementioned substrate processing apparatus, which is one of the processes for manufacturing a semiconductor device, will be described below with reference to FIG. 4A. In the following descriptions, the operations of the respective parts that constitute the substrate processing apparatus are controlled by the controller 121.

Figure 4A:
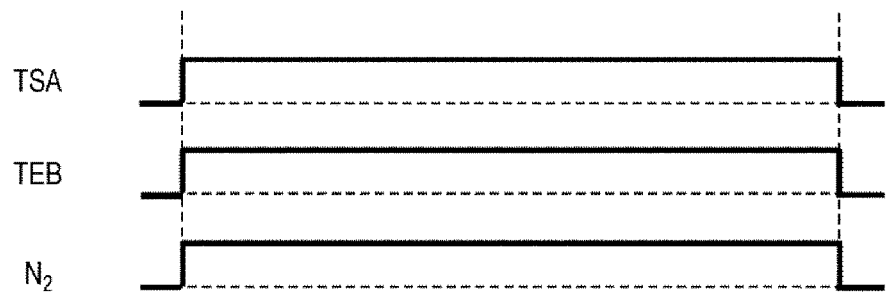
FIG. 4A is a diagram showing a film-forming sequence according to one embodiment of the present disclosure.

The film-forming sequence shown in FIG. 4A includes:
a film-forming step of forming a silicon fill film) doped with B, C and N as a film containing Si, B, C and N on a wafer 200 as a substrat performing, simultaneously at least for a predetermined period:
a step of supplying a TSA gas as a first precursor to the wafer 200; and
a step of supplying a TEB gas as a pseudo catalyst to the wafer 200,
wherein a substance containing an N—H bond is not supplied in the film-forming step.

In this specification, the Si film doped with B, C and N is also referred to as a silicon boron carbonitride film (SiBCN film) or simply as a Si film for the sake of convenience. In addition, in this specification, the film-forming sequence shown in FIG. 4A may be denoted as follows for the sake of convenience and may be indicated by using symbol [a]. The same notation will be used in the following description of modifications.

$$TSA=TEB \Rightarrow Si \quad [a]$$

When the term "wafer" is used herein, it may refer to "a wafer itself" or "a laminated body (aggregate) of a wafer and a predetermined layer or film formed on the surface of the wafer." That is to say, a wafer including a predetermined layer or film formed on its surface may be referred to as a wafer. In addition, when the phrase "a surface of a wafer" is used herein, it may refer to "a surface (exposed surface) of a wafer itself" or "a surface of a predetermined layer or film formed on a wafer", namely "an uppermost surface of the wafer as a laminated body."

Accordingly, in the present disclosure, the expression "a predetermined gas is supplied to a wafer" may mean that "a predetermined gas is directly supplied to a surface of a wafer itself" or that "a predetermined gas is supplied to a layer or film formed on a wafer, namely to an uppermost surface of a wafer as a laminated body." Furthermore, in the present disclosure, the expression "a predetermined layer (or film) is formed on a wafer" may mean that "a predetermined layer (or film) is directly formed on a surface of a wafer itself" or that "a predetermined layer (or film) is formed on a layer or film formed on a wafer, namely on an uppermost surface of a wafer as a laminated body."

In addition, when the term "substrate" is used herein, it may be synonymous with the term "wafer."

(Wafer Charging and Boat Loading)

When a plurality of wafers 200 are charged onto the boat 217 (wafer charging), the shutter 219s is moved by the shutter opening/closing mechanism 115s to open the lower end opening of the manifold 209 (shutter opening). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 through the O-ring 220b.

(Pressure Regulation and Temperature Adjustment Step)

The interior of the process chamber 201, namely the space in which the wafers 200 exist, is evacuated into a vacuum (evacuated into a reduced pressure) by the vacuum pump 246 so as to reach a desired pressure (desired degree of vacuum). In this case, the pressure inside the process chamber 201 is measured by the pressure sensor 245. The APC valve 244 is feedback-controlled based on the measured pressure information. The vacuum pump 246 may be continuously activated at least until the processing of the wafers 200 is completed. The wafers 200 in the process chamber 201 are heated by the heater 207 to a desired film-forming temperature. In this case, the state of supplying electric power to the heater 207 is feedback-controlled based on the temperature information detected by the temperature sensor 263 such that the interior of the process chamber 201 has a desired temperature distribution. In addition, the heating of the interior of the process chamber 201 by the heater 207 may be continuously performed at least until the processing of the wafers 200 is completed. The rotation of the boat 217 and the wafers 200 by the rotation mechanism 267 is started. The rotation of the boat 217 and the wafers 200 by the rotation mechanism 267 may be continuously performed at least until the processing of the wafers 200 is completed.

(Film-Forming Step)

In this step, a TSA gas and a TEB gas are simultaneously supplied to the wafers 200 in the process chamber 201. That is, the supply period of the TSA gas and the supply period of the TEB gas are overlapped.

Specifically, the valves 243a and 243b are opened, and the TSA gas and the TEB gas are caused to flow into the gas supply pipes 232a and 232b, respectively. The flow rates of the TSA gas and the TEB gas are adjusted by the MFCs 241a and 241b, respectively. The TSA gas and the TEB gas are supplied into the process chamber 201 via the nozzles 249a and 249b, and are exhausted from the exhaust pipe 231. At this time, the TSA gas and the TEB gas are supplied to the wafers 200 together, i.e., simultaneously. At the same time, the valves 243d and 243e may be opened to supply an $N_2$ gas into the gas supply pipes 232d and 232e. The flow rate of the $N_2$ gas is adjusted by the MFCs 241d and 241e. The $N_2$ gas is supplied together with the TSA gas and TEB gas into the process chamber 201, and is exhausted from the exhaust pipe 231.

At this time, the temperature of the wafer 200 (film-forming temperature) is set to a predetermined temperature falling within a range of, for example, 150 to 400 degrees C., preferably 250 to 350 degrees C. Further, the pressure inside the process chamber 201 (film-forming pressure) is set to a predetermined pressure falling within a range of, for example, 1 to 600 Pa, preferably 5 to 30 Pa. The above temperature range is a temperature at which TSA is not pyrolized (autolyzed) when at least TSA exists alone in the process chamber 201, and includes a temperature (150 to 325 degrees C.) at which either TSA or TEB is not pyrolized when each of TSA and TEB exists alone in the process chamber 201. The above temperature range is also a temperature at which DS is not pyrolized when DS used in the below-described modifications exists alone.

When the film-forming temperature is less than 150 degrees C. (or when the film-forming pressure is less than 1 Pa), the below-described film-forming reaction on the wafer 200 hardly proceeds. Thus, a practical deposition rate may not be obtained and the productivity may be reduced. In addition, a film with a poor quality, which contains a large amount of dangling bonds, may be formed on the wafer 200. By setting the film-forming temperature to 150 degrees C. or higher (or by setting the film-forming pressure to 1 Pa or higher), a film-forming reaction on the wafer 200 can be caused to proceed and a practical deposition rate can be obtained. In addition, it is possible to reduce the number of dangling bonds contained in the film formed on the wafer 200, thereby improving the quality of this film. By setting the film-forming temperature to 250 degrees C. or higher (or by setting the film-forming pressure to 5 Pa or higher), it is possible to further promote the film-forming reaction on the wafer 200 and to obtain a practical deposition rate. In addition, it is possible to further reduce the number of dangling bonds contained in the film formed on the wafer 200, thereby further improving the quality of the film.

If the film-forming temperature exceeds 400 degrees C. (or if the film-forming pressure exceeds 600 Pa), TEB is easily pyrolized, which may make it difficult to proceed with the film-forming process utilizing the catalytic action of TEB. By setting the film-forming temperature to 400 degrees C. or lower (or by setting the film-forming pressure to 600 Pa or lower), it is possible to suppress thermal decomposition of TEB and to proceed with the film-forming process utilizing the catalytic action of TEB. By setting the film-forming temperature to 350 degrees C. or lower (or by setting the film-forming pressure to 30 Pa or lower), it is possible to more reliably suppress thermal decomposition of TEB and to more reliably proceed with the film-forming process utilizing the catalytic action of TEB.

The supply flow rate of the TSA gas is set to a predetermined flow rate falling within a range of, for example, 1 to 2000 sccm, preferably 50 to 200 sccm. The supply flow rate of the TEB gas is set to a predetermined flow rate falling within a range of, for example, 1 to 1000 sccm, preferably 25 to 100 sccm. In the case of supplying an $N_2$ gas, the supply flow rate of the $N_2$ gas is set to a predetermined flow rate falling within a range of, for example, 1 to 10000 sccm. The supply flow rates of these gases may be appropriately determined depending on the composition of the film to be formed on the wafer 200.

By simultaneously supplying the TSA gas and the TEB gas to the wafer 200 under these conditions, it becomes possible to enable these gases to properly react in the process chamber 201. Then, under the catalytic action possessed by TEB, it is possible to decompose a part of TSA, i.e., to break at least some of the Si—H bonds in TSA, thereby extracting H from TSA. Si of TSA which has dangling bonds due to the extraction of H is quickly adsorbed and deposited on the wafer 200. As a result, the film-forming reaction of forming a Si film on the wafer 200 proceeds at a practical deposition rate of, for example, 5 Å/min or larger, preferably 10 Å/min or larger.

It is considered that TEB acts as a catalyst for the following reasons. That is, TEB is a chemical species having a low energy free-space trajectory, and acts as a Lewis acid, i.e., an electron pair acceptor in the reaction system of the present embodiment. In contrast, TSA acts as a Lewis base, i.e., an electron pair donor, in the reaction system of the present embodiment. TEB as a Lewis acid acts on TSA as a Lewis base, whereby protons ($H^+$) are extracted from TSA, and the film-forming process described above proceeds.

However, TEB acts mainly on the Si—H bonds, not the Si—N bonds, among the chemical bonds possessed by TSA. Therefore, in the course of the film-forming reaction described above, at least some of the Si—N bonds in TSA are held (maintained) without being broken. As a result, N is taken into the Si film formed on the wafer 200, while maintaining the Si—N bonds.

In addition, in the process of the above-described reaction, at least a part of TEB is decomposed by reacting with TSA. As a result, at least a part of B and C atoms contained in TEB is taken into the Si film formed on the wafer 200.

By performing the above-described film-forming reaction for a predetermined time, it becomes possible to form a Si film having a predetermined film thickness and containing B, C and N on the wafer 200. When performing the film-forming step of the present embodiment, a substance containing an N—H bond, such as an ammonia ($NH_3$) gas or the like, is not supplied. As a result, the Si film formed on the wafer 200 becomes a film containing almost no N—H bond.

As will be described later, the Si film formed in the present embodiment may be used as a film for a sidewall spacer (SWS) by controlling its composition, and may be used as a film for a silicon core in a double patterning (DP) process, i.e., as a film for a hard mask (silicon hard mask). In the case where the Si film formed on the wafer 200 is used as the SWS, it is preferable to appropriately adjust the execution time of the film-forming step and to set the film thickness of the Si film to, for example, 50 to 100 Å (5 to 10 nm). In the case where the Si film formed on the wafer 200 is used as the hard mask, it is preferable to appropriately adjust the execution time of the film-forming step and to set the film thickness of the Si film to, for example, 200 to 300 Å (20 to 30 nm).

As the first precursor, a substance (silylamine) represented by a structural formula of $N(SiX_3)_3$ may be used. X in the structural formula refers to at least one functional group (substituent) selected from the group consisting of hydrogen, a halogeno group, an alkyl group, an amino group, an alkoxy group and a hydroxy group. However, at least one of the nine X's contained in the above structural formula needs to be hydrogen. The term "halogeno group" as used herein refers to a halogen atom serving as a monovalent functional group, and may be a chloro group (—Cl), a fluoro group (—F), a bromo group (—Br), an iodo group (—I) or the like. In addition, the alkyl group referred to herein is a monovalent functional group represented by a structural formula of —$C_nH_{2n+1}$, which is formed by removing one H from a chain-like saturated hydrocarbon (alkane). Examples of the alkyl group include a methyl group (—$CH_3$), an ethyl group (—$C_2H_5$), a propyl group (—$C_3H_7$), an isopropyl group (—$CH(CH_3)CH_3$), a butyl group (—$C_4H_9$), an isobutyl group (—$CH_2CH(CH_3)_2$) and the like. In addition, the amino group referred to herein is a monovalent functional group represented by a structural formula of —$NR^1R^2$ (each of $R^1$ and $R^2$ is an alkyl group), and does not mean an amino group containing an N—H bond such as —$NH_2$, —NHR or the like. The term "alkoxy group" as used herein refers to a monovalent functional group represented by a structural formula of —OR, wherein an alkyl group (R) is bonded to an oxygen atom (O). The hydroxy group is a monovalent functional group represented by a structural formula of —OH. Examples of the silylamine having these functional groups include $N(SiH_2(NR^1R^2))_3$, $N(SiH(NR^1R^2)_2)_3$, $N(Si(NR^1R^2)_3)_3$, in addition to TSA.

As the first precursor, in addition to silylamine, a substance represented by a composition formula of $Si_nC_mH_{2n+}$ $_{2m+2}$ (where n or m is an integer of 1 or more), i.e., an organic silane having no unsaturated bond may be used. As the organic silane, it may be possible to use a substance such as monomethylsilane ($SiCH_6$), monoethylsilane ($SiC_2H_8$), dimethylsilane ($SiC_2H_8$), 1,2-disilapropane ($Si_2CH_8$), 1,3-disilapopropane ($Si_2CH_8$), trimethylsilane ($SiC_3H_{10}$), monopropylsilane ($SiC_3H_{10}$), 1,2-disilabutane ($Si_2C_2H_{10}$), 1,3-disilabutane ($Si_2C_2H_{10}$), 1,4-disilabutane ($Si_2C_2H_{10}$), 2,3-disilabutane ($Si_2C_2H_{10}$), 2,4-disilapentane ($Si_2C_3H_{12}$), 1,3,5-trisilapentane ($Si_3C_2H_{12}$) or the like, i.e., a silane containing an alkyl group or an alkylene group. The alkylene group is a divalent functional group represented by a structural formula of $—C_nH_{2n+2}—$, which is formed by removing two H atoms from an alkane. Examples of the alkylene group include a methylene group ($—CH_2—$), an ethylene group ($—C_2H_4—$), a propylene group ($—C_3H_6—$), a butylene group ($—C_4H_8—$) and the like.

As the first precursor, a substance represented by a composition formula of $Si_nC_mH_{2n+2m}$ (where n is an integer of 1 or more, and m is an integer of 2 or more), i.e., an organic silane containing a vinyl group ($—CH═CH_2$) or an allyl group ($—CH_2CH═CH_2$) and having an unsaturated bond, or an organic silane having a cyclic structure (cyclo structure) may also be used. As such an organic silane, it may be possible to use a substance such as vinylsilane ($SiC_2H_6$), methylvinylsilane ($SiC_3H_6$), allylsilane ($SiC_3H_6$), silacyclobutane ($SiC_3H_6$), 1,3-disilacyclobutane ($Si_2C_2H_6$) or the like. These substances are substances containing at least a Si—C bond and a Si—H bond, and may contain a C—H bond or a C—C bond.

If silylamine containing an alkyl group, i.e., a substance acting not only as a Si source and an N source but also as a C source, is used as the first precursor, as compared with a case where TSA is used as the first precursor, it is possible to control the C concentration in the Si film formed on the wafer 200 in an increasing direction.

Further, if silylamine containing an amino group, i.e., a substance containing a larger amount of Si—N bonds than TSA, is used as the first precursor, as compared with a case where TSA is used as the first precursor, it is possible to increase the amount of Si—N bonds contained in the Si film formed on the wafer 200 to control the N concentration in the film in an increasing direction.

In addition, if silylamine containing an alkoxy group, i.e., a substance acting not only as a Si source and an N source but also as a C source and an O source, is used as the first precursor, as compared with a case where TSA is used as the first precursor, it is possible to control the C concentration in the Si film formed on the wafer 200 in an increasing direction and to add a small amount of O to the film.

Moreover, if silylamine containing a hydroxyl group, i.e., a substance acting not only as a Si source and an N source but also as an O source, is used as the first precursor, it is possible to add a small amount of O to the Si film formed on the wafer 200.

In addition, if an organic silane containing a Si—C bond and a Si—H bond and not containing a Si—N bond is used as the first precursor, namely if a substance acting as a Si source and not acting as an N source is used as the first precursor, it is also possible to avoid the addition of N into the Si film formed on the wafer 200. That is, a Si film doped with B and C and not containing N can be formed on the wafer 200. In the present specification, the Si film doped with B and C is also referred to as a silicon boron carbide film (SiBC film) or simply as a Si film for the sake of convenience.

As described above, as the first precursor, it may be possible to suitably use a substance containing at least one selected from the group consisting of hydrogen, a halogeno group, an alkyl group, an alkylene group, an amino group, an alkoxy group, a hydroxy group, a vinyl group and an allyl group, a structural isomer thereof and a derivative thereof, as long as such a substance contains a Si—N bond or a Si—C bond, contains a Si—H bond, and does not contain an N—H bond. By appropriately selecting the type of the first precursor, it is possible to control the composition and physical properties of the film formed on the wafer 200 over a wide range and in a precise manner.

As the pseudo catalyst, a substance (boron compound) represented by a structural formula of $BX_3$ may be suitably used. X in the structural formula is at least one functional group selected from the group consisting of hydrogen, a halogeno group, an alkyl group, an amino group, an alkoxy group and a hydroxy group. Examples of boron compounds having these functional groups include, in addition to TEB, borane (boron hydride) such as diborane ($B_2H_6$) or the like, haloborane such as trichloroborane ($BCl_3$), trifluoroborane ($BF_3$), tribromoborane ($BBr_3$), triiodoborane ($BI_3$) or the like, alkylborane such as trimethylborane ($B(CH_3)_3$), triethylborane ($B(C_2H_5)_3$), triisopropylborane ($B(C_3H_7)_3$), tributylborane ($B(C_4H_9)_3$) or the like, aminoborane such as trisdimethylaminoborane ($B[N(CH_3)_2]_3$), trisdiethylaminoborane ($B[N(C_2H_5)_2]_3$), trisdipropylaminoborane ($B[N(C_3H_7)_2]_3$), tri sdibutylaminoborane ($B[N(C_4H_9)_2]_3$) or the like, and boric acid compound such as trimethyl borate ($B(OCH_3)_3$), triethyl borate ($B(OC_2H_5)_3$), tripropyl borate ($B(OC_3H_7)_3$), tributyl borate ($B(OC_4H_9)_3$), boric acid ($B(OH)_3$) or the like.

If C-free boron hydride or haloborane, i.e., a substance acting as a B source and not acting as a C source, is used as the pseudo catalyst, it is possible to avoid the addition of C into the Si film formed on the wafer 200. That is, a C-free Si film doped with B and N can be formed on the wafer 200. In this specification, the Si film doped with B and N is also referred to as a silicon boronitride film (SiBN film) or simply as a Si film for the sake of convenience.

Further, if alkylborane having a larger C content (a larger number of C atoms contained in one molecule) than TEB is used as the pseudo catalyst, as compared with a case where TEB is used as the pseudo catalyst, it is possible to increase the C concentration in the Si film formed on the wafer 200. In addition, if alkylborane having a smaller C content than TEB is used as the pseudo catalyst, as compared with a case where TEB is used as the pseudo catalyst, the C concentration in the Si film formed on the wafer 200 can be controlled in a decreasing direction.

Further, if aminoborane, i.e., a substance acting not only as a B source and a C source but also as an N source, is used as the pseudo catalyst, as compared with a case where TEB is used as the pseudo catalyst, the N concentration in the Si film formed on the wafer 200 can be controlled in an increasing direction.

As the pseudo catalyst, in addition to the boron compound described above, it may be possible to use an aluminum compound containing an alkyl group, which is represented by a structural formula such as $Al(CH_3)_3$, $Al(C_2H_5)_3$, $Al(C_3H_7)_3$ or the like, or an aluminum compound containing a halogeno group, which is represented by a structural formula such as $AlCl_3$ or the like. These substances are N—H bond-free substances containing aluminum (Al) as Group 13 element. If an aluminum compound containing an alkyl group is used as the pseudo catalyst, a film containing Si, Al, C and N, i.e., a Si film (SiAlCN film) doped with Al, C and N, can be formed on the wafer 200. In addition, if an alkyl-group-free aluminum compound is used as the pseudo catalyst, a film containing Si, Al and N, i.e., a Si film (STAIN film) doped with Al and N, can be formed on the wafer 200.

As described above, as the pseudo catalyst, it may be possible to suitably use a substance containing at least one selected from the group consisting of hydrogen, a halogeno group, an alkyl group, an amino group, an alkoxy group and a hydroxy group, a structural isomer thereof and a derivative thereof, as long as an N—H bond-free substance containing a Group 13 element is used as the pseudo catalyst. By appropriately selecting the type of the pseudo catalyst, it is possible to control the composition and physical properties of the film formed on the wafer 200 over a wide range and in a precise manner.

As the inert gas, in addition to the $N_2$ gas, for example, a rare gas such as an Ar gas, a He gas, a Ne gas, a Xe gas or the like may be used.

(After-Purge Step and Atmospheric Pressure Restoration Step)

After the film-forming step is completed and the film having a desired composition is formed on the wafer 200, the valves 243a and 243b are closed to stop the supply of the TSA gas and the TEB gas into the process chamber 201. Furthermore, the $N_2$ gas is supplied into the process chamber 201 from the respective gas supply pipes 232d and 232e and is exhausted from the exhaust pipe 231. The $N_2$ gas acts as a purge gas. Thus, the interior of the process chamber 201 is purged, and the gas and the reaction byproduct remaining in the process chamber 201 are removed from the interior of the process chamber 201 (after-purge). Thereafter, the atmosphere inside the process chamber 201 is substituted with an inert gas (inert gas substitution), and the pressure inside the process chamber 201 is restored to an atmospheric pressure (atmospheric pressure restoration).

(Boat Unloading and Wafer Discharging)

Thereafter, the seal cap 219 is lowered by the boat elevator 115, the lower end of the manifold 209 is opened, and the processed wafers 200 are unloaded from the lower end of the manifold 209 to the outside of the reaction tube 203 in a state in which the processed wafers 200 are supported by the boat 217 (boat unloading). After the boat unloading, the shutter 219s is moved, and the lower end opening of the manifold 209 is sealed by the shutter 219s via the O-ring 220c (shutter closing). The processed wafers 200 are taken out from the boat 217 after they are unloaded to the outside of the reaction tube 203 (wafer discharging).

(3) Effects of the Present Embodiment

According to the present embodiment, one or more of the following effects may be obtained.

(a) In the film-forming step, the TSA gas acting as a Lewis base and the TEB gas acting as a Lewis acid are simultaneously supplied to the wafer 200, whereby TEB can be caused to act as a catalyst. By this catalytic action, it becomes possible to perform the film-forming process on the wafer 200 at a practical rate under the aforementioned low temperature condition. By performing the film-forming process under the low temperature condition, it is possible to reduce the thermal damage received by the wafer 200 and to satisfactorily control the thermal history.

(b) By using a substance such as TSA or the like containing a Si—N bond and not containing an N—H bond as the first precursor, the addition of N into the film formed on the wafer 200 can be performed in the form of a Si—N bond and not in the form of an N—H bond. In addition, in the film-forming step, a substance such as an $NH_3$ gas or the like containing an N—H bond is not supplied to the wafer 200. Therefore, it is possible to more reliably suppress the addition of the N—H bond into the film formed on the wafer 200.

Thus, a film can be formed on the wafer 200 so as to have a high oxidation resistance (ashing resistance). According to the intensive study conducted by the present inventors, it has been found that N taken into the film in the state of Si—N bond acts as a protective (guard) element for suppressing oxidation of the film, whereas N taken into the film in the state of N—H bond may induce oxidation of the film. It has been confirmed that, as compared with the film formed by using an $NH_3$ gas as an N source (the film containing a large amount of N—H bonds and containing almost no Si—N bond), the film formed according to the present embodiment (the film containing a large amount of Si—N bonds and containing almost no N—H bond) exhibits a high ashing resistance even if the N concentration in the film remains substantially the same.

(c) By using a substance such as TSA or the like containing a Si—N bond as the first precursor, it becomes possible to form a Si film containing a high-quality Si—N bond on the wafer 200 at a low temperature. As a result, a film having a good ashing resistance can be formed at a low temperature. This film can be used as, for example, a sacrificial film (processed film) suitable for use as a hard mask, or a low dielectric constant film (Low-k film) suitable for use as a SWS.

By using a substance having a larger N content (a number of N atoms contained in one molecule) than TSA as the first precursor, it is possible to further increase the amount of N added to the Si film. As described above, in the film-forming sequence shown in FIG. 4A, the ratio (N/SiBCN ratio) of the amount of N to the amount of Si, B, C and N contained in the Si film formed on the wafer 200 can be controlled, for example, by appropriately selecting the type of the first precursor. By increasing the amount of N added to the Si film and increasing the N/SiBCN ratio, it is possible to improve the ashing resistance of the Si film and to reduce the extinction coefficient (attenuation coefficient). The extinction coefficient is a coefficient that indicates the degree of attenuation of the intensity of light which is absorbed by the Si film when the light travels through the substance (Si film). The attenuation grows larger as the value of the extinction coefficient increases. In the photolithography step performed after the film-forming step, it is desirable that the extinction coefficient of the Si film is low in order to reliably check an alignment mark or the like. In the film-forming sequence shown in FIG. 4A, it is difficult to change the aforementioned N/SiBCN ratio even if the film-forming temperature or the film-forming pressure is changed.

(d) In the film-forming step, by increasing the supply flow rate of the TSA gas, increasing the partial pressure or the concentration of the TSA gas in the process chamber 201, or using the substance having a higher content of Si than the TSA as the first precursor, it is possible to increase the ratio (Si/SiBCN ratio) of the amount of Si to the amount of Si, B, C and N contained in the Si film, i.e., the content ratio of Si. This makes it possible to increase the ashing resistance of the Si film and to increase the resistance of the Si film to hydrogen fluoride (HF) or the like, i.e., the etching resistance. Thus, the film can be used as a sacrificial film suitable for use as a hard mask. In this manner, in the film-forming sequence shown in FIG. 4A, the Si/SiBCN ratio of the Si film formed on the wafer 200 can be controlled by, for example, appropriately selecting the supply flow rate of the first precursor (the supply flow rate ratio of the first precursor to the pseudo catalyst) or the kind of the first precursor.

In the film-forming sequence shown in FIG. 4A, it is difficult to change the Si/SiBCN ratio even if the film-forming temperature or the film-forming pressure is changed.

(e) By using the substance containing B and C, such as TEB or the like, as the pseudo catalyst, it becomes possible to add B and C into the Si film formed on the wafer 200.

In the film-forming step, by increasing the supply flow rate of the TEB gas, increasing the partial pressure or the concentration of the TEB gas in the process chamber 201, or using the substance having a larger C content than TEB as the pseudo catalyst, it is possible to increase the amount of B or C added into the Si film. By increasing the amount of B or C added into the Si film and increasing the ratio (B or C/SiBCN ratio) of the amount of B or C to the amount of Si, B, C and N contained in the Si film, it is possible to improve the etching resistance and to lower the extinction coefficient. This makes it possible to use the film as a low-k film suitable for use as, for example, a side wall spacer.

In addition, by decreasing the supply flow rate of the TEB gas in the film-forming step, lowering the partial pressure or the concentration of the TEB gas in the process chamber 201, or using the substance having a lower content of C than TEB as the pseudo catalyst, it is possible to reduce the amount of B or C added into the Si film. By decreasing the content of B or C in the Si film, it becomes possible to improve the ashing resistance of the Si film.

As described above, in the film-forming sequence shown in FIG. 4A, the B or C/SiBCN ratio of the Si film formed on the wafer 200 can be controlled by, for example, appropriately selecting the supply flow rate of the pseudo catalyst (the supply flow rate ratio of the pseudo catalyst to the first precursor) or the kind of the pseudo catalyst. In the film-forming sequence shown in FIG. 4A, it is difficult to change the B or C/SiBCN ratio even if the film-forming temperature or the film-forming pressure is changed.

(f) By using the gas such as TEB or the like not containing an halogen element such as Cl or the like as the pseudo catalyst, it is possible to avoid infiltration of impurities such as Cl and the like into the Si film formed on the wafer 200. As a result, the Si film formed on the wafer 200 can be made into a high-quality film having a high ashing resistance and a high etching resistance.

(g) By using the gas such as TEB or the like not containing an halogen element such as Cl or the like as the pseudo catalyst, it becomes possible to increase the deposition rate of the film formed on the wafer 200. This is because, if a $BCl_3$ gas or the like is used as the pseudo catalyst, the film under formation may be etched by $BCl_3$ and the deposition rate may decrease. If the TEB gas is used as the pseudo catalyst, it is possible to avoid such a phenomenon.

(h) By using two kinds of gases, the TSA gas and the TEB gas, it becomes possible to form a film containing four elements Si, B, C and N. That is, it is unnecessary to separately supply four sources, i.e., a Si source, a B source, a C source and an N source during film formation. Therefore, it is possible to shorten the time required for the film-forming process and to improve the productivity. In addition, by reducing the types of gases required for film formation, it is possible to simplify the configuration of the gas supply system and to reduce the apparatus cost or the like.

(i) As long as the substance containing a Si—N bond or a Si—C bond, containing a Si—H bond, and not containing an N—H bond is used as the first precursor, the aforementioned effects can be similarly obtained even when a substance other than TSA is used. In addition, as long as the substance containing a Group 13 element and not containing an N—H bond is used as the pseudo catalyst, the aforementioned effects can be similarly obtained even when a substance other than TEB is used.

(4) Modifications

The film-forming step according to the present embodiment may be changed as in the following modifications.

(Modification 1)

Figure 4B:
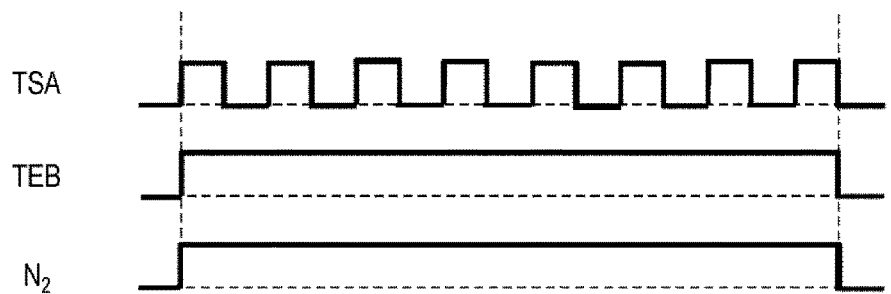
FIGS. 4B to 4D are diagrams respectively showing modifications of the film-forming sequence according to one embodiment of the present disclosure.

As in the film-forming sequence shown in FIG. 4B and denoted by symbol [b] below, in the film-forming step, the supply of a TSA gas may be intermittently performed a predetermined number of times (n times) during the supply period of a TEB gas.

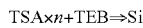

TSA×$n$+TEB⇒Si    [b]

Even in this modification, the same effects as those of the film-forming sequence shown in FIG. 4A may be obtained. Further, according to this modification, it is possible to reduce the total supply amount (exposure amount) of the TSA gas to the wafer 200 and to increase the B or C/SiBCN ratio of the Si film formed on the wafer 200. As a result, it is possible to control the etching resistance of the Si film formed on the wafer 200 in an increasing direction or to control the extinction coefficient in a decreasing direction.

(Modification 2)

Figure 4C:
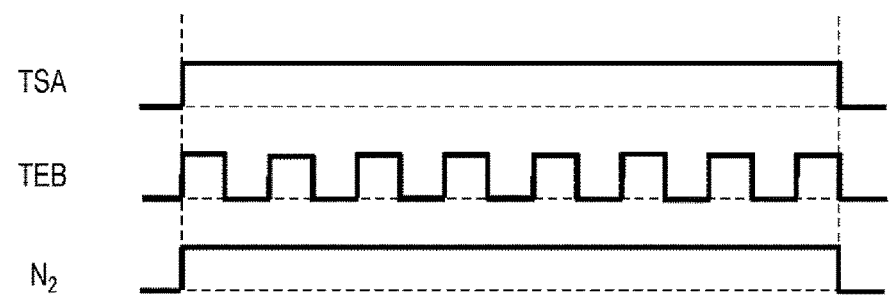

As in the film-forming sequence shown in FIG. 4C and denoted by symbol [c] below, in the film-forming step, the supply of a TEB gas may be intermittently performed a predetermined number of times (n times) during the supply period of a TSA gas.

TSA+TEB×$n$⇒Si    [c]

Even in this modification, the same effects as those of the film-forming sequence shown in FIG. 4A may be obtained. Further, according to this modification, it is possible to reduce the total supply amount (exposure amount) of the TEB gas to the wafer 200 and to reduce the B or C/SiBCN ratio of the Si film formed on the wafer 200. As a result, it is possible to control the ashing resistance of the Si film formed on the wafer 200 in an increasing direction.

(Modification 3)

Figure 4D:
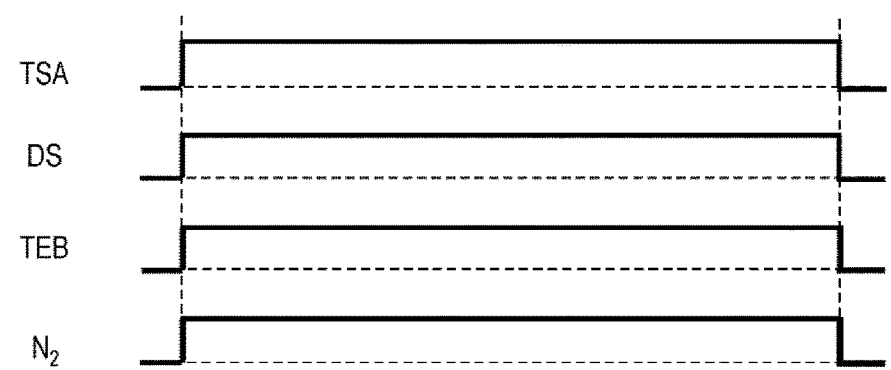

As in the film-forming sequence shown in FIG. 4D and denoted by symbol [d] below, the film-forming step may further include a step in which a step of supplying a DS gas is performed so as to overlap with a step of supplying a TSA gas and a step of supplying a TEB gas at least for a predetermined period of time. The supply flow rate and supply time of the DS gas may be set similarly to the supply flow rate and supply time of the TSA gas. In addition, the film-forming sequence shown in FIG. 4D and denoted by symbol [d] shows a case where the TSA gas, the DS gas and the TEB gas are simultaneously and continuously supplied during the execution period of the film-forming step.

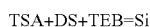

TSA+DS+TEB=Si    [d]

Even in this modification, the same effects as those of the film-forming sequence shown in FIG. 4A may be obtained.

In addition, according to this modification, by simultaneously supplying the DS gas containing a Si—H bond and acting as a Lewis base and the TEB gas acting as a Lewis acid, it is possible to promote the extraction of H from DS due to the catalytic action of TEB, i.e., the decomposition of DS. As a result, it becomes possible to efficiently add Si contained in DS into the Si film formed on the wafer 200. That is, it is possible to increase the Si content ratio (Si/SiBCN ratio) in the Si film formed on the wafer 200. This makes it possible to control the ashing resistance of the Si film formed on the wafer 200 in an improving direction and to control the etching resistance of the Si film formed on the wafer 200 in an improving direction.

Further, according to this modification, by adjusting the supply flow rate and the supply time of the DS gas, as compared with the film-forming sequence shown in FIG. 4A, it is possible to control the N/SiBCN ratio or the B or C/SiBCN ratio over a wide range and in a free manner.

For example, by increasing the ratio (TSA/DS) of the supply flow rate of the TSA gas to the supply flow rate of the DS gas, it is possible to control the N/SiBCN ratio in the Si film formed on the wafer 200 in an increasing direction. In addition, by reducing the TSA/DS, it is possible to control the N/SiBCN ratio in the Si film formed on the wafer 200 in a decreasing direction.

Further, for example, by increasing the ratio (TEB/DS) of the supply flow rate of the TEB gas to the supply flow rate of the DS gas, it is controlled to control the B or C/SiBCN ratio in the Si film formed on the wafer 200 in an increasing direction. In addition, by reducing the TEB/DS, it becomes possible to control the B or C/SiBCN ratio in the Si film formed on the wafer 200 in a decreasing direction.

As the second precursor, in addition to the DS, it may be possible to use a substance such as $SiH_4$, $Si_3H_8$, $Si_4H_{10}$ or the like, i.e., silicon hydrides represented by a general formula of $Si_nH_{2n+2}$ (where n is an integer of 1 or 2 or more). By using silicon hydride higher in order than DS as the second precursor, it becomes possible to increase the Si content ratio (Si/SiBCN ratio) in the Si film formed on the wafer 200. Since the catalytic action by TEB can be obtained as long as TEB has a Si—H bond, a silane (halosilane) containing a halogeno group, which is represented by a chemical formula such as $SiH_3Cl$, $SiH_2Cl_2$ or the like, may be used as the second precursor. Further, a silicon compound containing an amino group (—$NR^1R^2$), which is represented by a chemical formula such as $SiH[N(CH_3)_2]_3$, $SiH_2[N(C_2H_5)_2]_2$ or the like, i.e., aminosilane containing a Si—H bond and a Si—N bond and not containing an N—H bond, may be used as the second precursor. By using such an aminosilane as the second precursor, it is possible to increase the amount of Si—N bonds contained in the Si film formed on the wafer 200 and to control the N concentration in this film in an increasing direction.

(Modification 4)

As in the film-forming sequence denoted by symbol [e] below, step 1 of supplying a TSA gas to the wafer 200 and step 2 of supplying a TEB gas to the wafer 200 may be alternately performed a predetermined number of times (n times). In this case, in each of steps 1 and 2, a residual gas removal step of removing a residual gas and the like from the inside of the process chamber 201 is not performed. This makes it possible to mix the TSA gas and the TEB gas in the process chamber 201 and to proceed with the film-forming process using the catalytic action of TEB. According to this modification, the step coverage, the film thickness controllability and the like of the Si film formed on the wafer 200 can be improved as compared with a case where the TSA gas and the TEB gas are simultaneously supplied.

(TSA→TEB)×$n$⇒Si         [e]

(Modification 5)

As set forth below, the film-forming sequences denoted by symbols [a] to [e] may be repeated or combined with or without the purge in the process chamber 201 interposed therebetween. When combining a plurality of film-forming sequences, it is also possible to arbitrarily change the film-forming sequences, for example, to change the execution order of the film-forming sequences. In addition to the following, three or more kinds of film-forming sequences may be arbitrarily combined and used.

[a]×n⇒Si
[b]×n⇒Si
[c]×n⇒Si
[d]×n⇒Si
[e]×n⇒Si
([a]→[b])×n⇒Si
([a]→[c])×n⇒Si
([a]→[d])×n⇒Si
([a]→[e])×n⇒Si
([b]→[c])×n⇒Si
([b]→[d])×n⇒Si
([b]→[e])×n⇒Si
([c]→[d])×n⇒Si
([c]→[e])×n⇒Si
([d]→[e])×n⇒Si (Modification 6)

In the film-forming sequences denoted by symbols [a] to [e], when supplying the TSA gas, the TEB gas or the like into the process chamber 201, the opening degree of the APC valve 244 may be set to be very small, or the APC valve 244 may be fully closed, and the exhaust system may be substantially closed, whereby a state in which the gases are substantially contained in the process chamber 201 may be maintained for a predetermined time. Thus, it is possible to sufficiently secure the reaction time necessary for exerting the catalytic action by TEB and to reliably perform the above-described film-forming process. When setting the opening degree of the APC valve 244 to be very small, it is preferable that the supply flow rate of the TSA gas and the TEB gas supplied into the process chamber 201 is set to be higher than the exhaust flow rate of the TSA gas and the TEB gas exhausted from the process chamber 201. In addition, when the state in which the gases are contained in the process chamber 201 is maintained for a predetermined time, a predetermined amount of gas is supplied into the process chamber 201 in a state in which the exhaust system is substantially closed, and then the supply of the gas into the process chamber 201 is stopped. By maintaining this state for a predetermined time, it is possible to reduce the amount of gas used and to reduce the gas cost.

OTHER EMBODIMENTS

The embodiment of the present disclosure has been concretely described above. However, the present disclosure is not limited to the embodiment described above, and various changes may be made without departing from the spirit thereof.

Recipes (programs describing processing procedures and processing conditions) used in substrate processing may be prepared individually according to the processing contents (the kind, composition ratio, quality, film thickness, processing procedure and processing condition of the film as formed) and may be stored in the memory device 121c via a telecommunication line or the external memory device 123. Moreover, at the start of substrate processing, the CPU 121a may properly select an appropriate recipe from the recipes stored in the memory device 121c according to the processing contents. Thus, it is possible for one substrate processing apparatus to form films of different kinds, composition ratios, qualities and thicknesses with enhanced reproducibility. In addition, it is possible to reduce an operator's burden (e.g., a burden borne by an operator when inputting processing procedures and processing conditions) and to quickly start the substrate processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the above-described embodiment, an example in which a film is formed using a batch type substrate processing apparatus for processing a plurality of substrates at a time has been described. The present disclosure is not limited to the above-described embodiment, but may be suitably applied to a case where a film is formed using, for example, a single-wafer type substrate processing apparatus for processing one or several substrates at a time. Further, in the above-described embodiment, an example in which a film is formed using a substrate processing apparatus having a hot wall type process furnace has been described. The present disclosure is not limited to the above-described embodiment, but may be suitably applied to a case where a film is formed using a substrate processing apparatus having a cold wall type process furnace.

Figure 9:
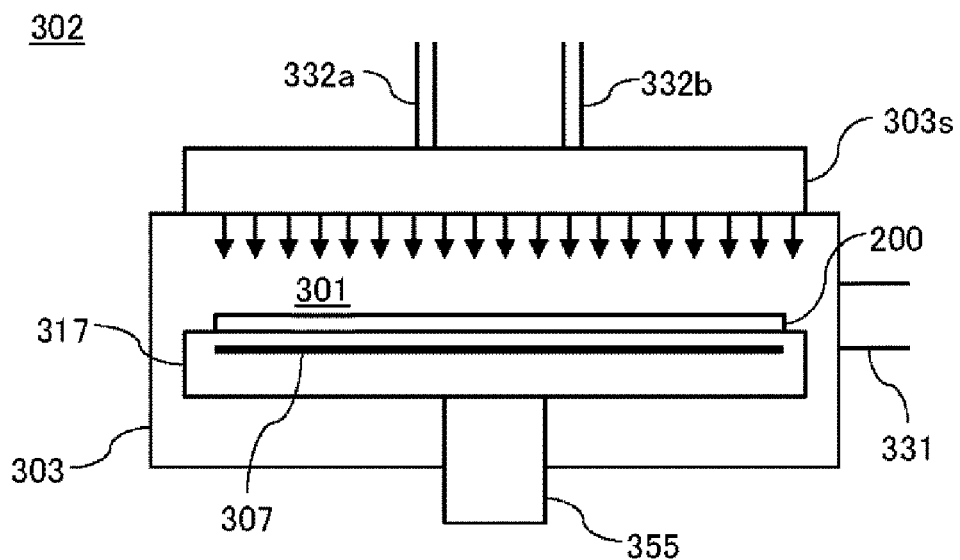
FIG. 9 is a schematic configuration view of a process furnace of a substrate processing apparatus suitably used in another embodiment of the present disclosure, in which a portion of the process furnace is shown in a vertical cross section.

For example, the present disclosure may also be suitably applied to a case where a film is formed by using a substrate processing apparatus provided with the process furnace 302 shown in FIG. 9. The process furnace 302 includes a process container 303 forming a process chamber 301, a shower head 303s serving as a gas supply part for supplying a gas into the process chamber 301 in a shower shape, a support base 317 for supporting one or several wafers 200 in a horizontal posture, a rotation shaft 355 for supporting the support base 317 from below, and a heater 307 installed on the support base 317. Gas supply ports 332a and 332b are connected to the inlet (gas introduction port) of the shower head 303s. A supply system similar to the first and second precursor supply systems of the above-described embodiment is connected to the gas supply port 332a. A supply system similar to the pseudo catalyst supply system of the above-described embodiment is connected to the gas supply port 332b. At the outlet (gas discharge port) of the shower head 303s, there is installed a gas dispersion plate for supplying a gas into the process chamber 301 in a shower shape. The shower head 303s is installed at a position facing the surface of the wafer 200 carried into the process chamber 301. An exhaust port 331 for exhausting the interior of the process chamber 301 is installed in the process container 303. An exhaust system similar to the exhaust system of the above-described embodiment is connected to the exhaust port 331.

Figure 10:
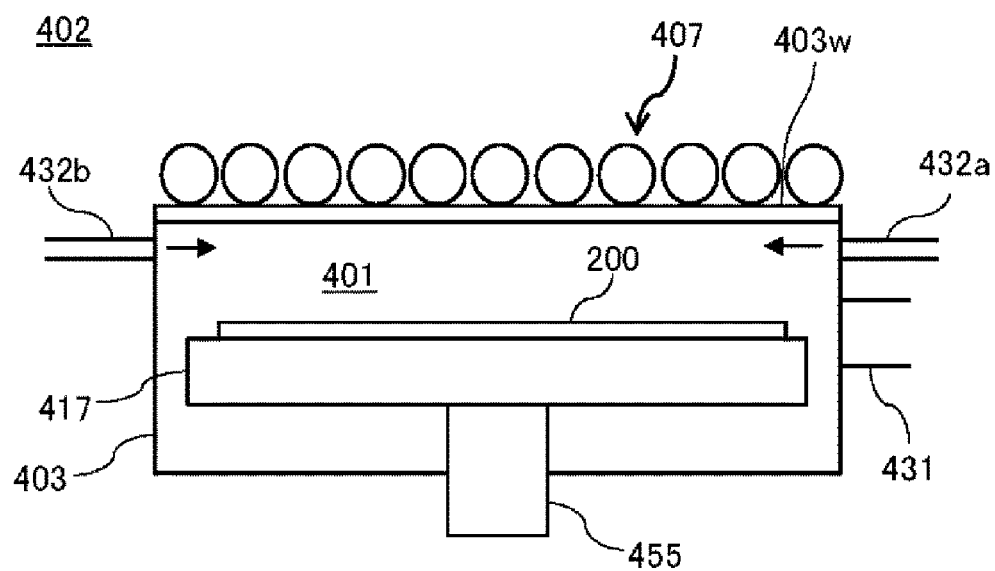
FIG. 10 is a schematic configuration view of a process furnace of a substrate processing apparatus suitably used in a further embodiment of the present disclosure, in which a portion of the process furnace is shown in a vertical cross section.

In addition, for example, the present disclosure may also be suitably applied to a case where a film is formed by using a substrate processing apparatus provided with a process furnace 402 shown in FIG. 10. The process furnace 402 includes a process container 403 forming a process chamber 401, a support base 417 for supporting one or several wafers 200 in a horizontal posture, a rotation shaft 455 for supporting the support base 417 from below, a lamp heater 407 for irradiating light toward the wafer 200 in the process container 403, and a quartz window 403w for transmitting the light irradiated from the lamp heater 407. Gas supply ports 432a and 432b are connected to the process container 403. A supply system similar to the first and second precursor supply systems of the above-described embodiment is connected to the gas supply port 432a. A supply system similar to the pseudo catalyst supply system of the above-described embodiment is connected to the gas supply port 432b. The gas supply ports 432a and 432b are respectively provided at positions not facing the side of the end portion of the wafer 200 loaded into the process chamber 401, i.e., the surface of the wafer 200 loaded into the process chamber 401. An exhaust port 431 for exhausting the inside of the process chamber 401 is provided in the process container 403. An exhaust system similar to the exhaust system of the above-described embodiment is connected to the exhaust port 431.

Even in the case of using these substrate processing apparatuses, a film-forming process can be performed under the same processing procedures and processing conditions as those of the above-described embodiment and modifications, and the same effects as those of the above-described embodiment and modifications may be obtained.

In the embodiment and modifications described above, an example in which a film containing Si as a main element is formed on a substrate has been described. However, the present disclosure is not limited to such forms. That is, the present disclosure may be suitably applied to a case where a film containing not only Si but also a semimetal element such as germanium (Ge), B or the like as a main element is formed on a substrate. In addition, the present disclosure may be suitably applied to a case where a film containing, as a main element, a metal element such as titanium (Ti), zirconium (Zr), hafnium (Hf), niobium (Nb), tantalum (Ta), molybdenum (Mo), tungsten (W), yttrium (Y), lanthanum (La), strontium (Sr), aluminum (Al) or the like is formed on a substrate.

The above-described embodiments, modifications and the like may be used in combination as appropriate. The processing procedures and processing conditions at this time may be the same as, for example, the processing procedures and processing conditions of the above-described embodiment.

EXAMPLES

Example 1

Film formation evaluations A1 to A3 were respectively carried out using the substrate processing apparatus according to the above-described embodiment. In the film formation evaluation A1, a film-forming process according to the film-forming sequence shown in FIG. 4A was carried out under the film-forming temperatures of 300 degrees C., 325 degrees C. and 350 degrees C., respectively. In the film formation evaluation A2, a film-forming process according to a film-forming sequence in which a TEB gas alone is supplied to a wafer was carried out under the film-forming temperatures of 325 degrees C., 350 degrees C., 375 degrees C. and 400 degrees C., respectively. In the film formation evaluation A3, a film-forming process according to a film-forming sequence in which a TSA gas alone is supplied to a wafer was carried out under the film-forming temperatures of 500 degrees C. and 525 degrees C., respectively. Other processing conditions are conditions falling within the condition range described in the above embodiment and are common to the film formation evaluations A1 to A3.

Figure 6:
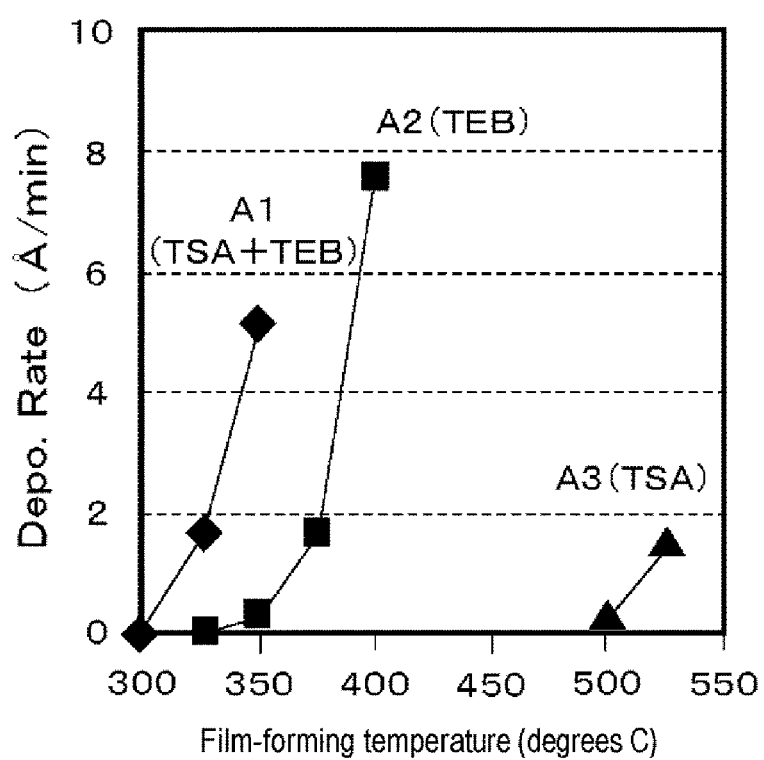
FIG. 6 is a diagram showing an evaluation result of a deposition rate.

Then, the deposition rates in the film formation evaluations A1 to A3 were respectively evaluated. FIG. 6 is a diagram showing the evaluation result of the deposition rate. In FIG. 6, the horizontal axis represents the film-forming temperature and the vertical axis represents the deposition rate (Å/min). In FIG. 6, ♦, ■ and ▲ indicate film formation evaluations A1 to A3, respectively. According to FIG. 6, it can be noted that in the film formation evaluation A1, it is difficult to obtain a practical deposition rate when the film-forming temperature is set to 300 degrees C. and it is possible to obtain a practical deposition rate by setting the film-forming temperature to 325 degrees C. or higher. Further, it can be noted that in the film formation evaluation A2, it is difficult to obtain a practical deposition rate when the film-forming temperature is set to 350 degrees C. or lower and it is possible to obtain a practical deposition rate by setting the film-forming temperature to 375 degrees C. or higher. In addition, it can be noted that in the film formation evaluation A3, it is difficult to obtain a practical deposition rate when the film-forming temperature is set to 500 degrees C. or lower and it is possible to obtain a practical deposition rate by setting the film-forming temperature to 525 degrees C. or higher.

By simultaneously supplying the TSA gas and the TEB gas in this way, as compared with a case where the gases are individually supplied, it becomes possible to lower the film-forming temperature. Further, by simultaneously supplying the TSA gas and the TEB gas, it is possible to perform a film-forming process at a practical deposition rate in a low temperature region where it is impossible to perform a film-forming process when the gases are individually supplied. This is probably due to the fact that by supplying the TEB gas together with the TSA gas, the amount of energy (activation energy) required for activating TSA is decreased and TSA is easy to activate. The present inventors have found that in the case of simultaneously supplying the TSA gas and the TEB gas, by appropriately adjusting the pressure in the process chamber (the partial pressure of the TSA gas and the TEB gas in the process chamber), it is possible to perform a film-forming process at a practical deposition rate even in a lower temperature region of 300 degrees C. or lower, for example, under a temperature condition of 250 degrees C. or lower.

Example 2

Film formation evaluations B1 to B3 were respectively carried out using the substrate processing apparatus according to the above-described embodiment. In the film formation evaluation B1, a film-forming process according to the film-forming sequence shown in FIG. 4A was carried out under a film-forming temperature of 350 degrees C. and a total partial pressure of a TSA gas and a TEB gas in a process chamber of 3 Pa. In the film formation evaluation B2, the same film-forming process as that of the film formation evaluation B1 was carried out under a film-forming temperature of 325 degrees C. and total partial pressures of a TSA gas and a TEB gas in a process chamber of 3 Pa, 9 Pa and 30 Pa. In the film formation evaluation B3, the same film-forming process as that of the film formation evaluation B1 was carried out under a film-forming temperature of 300 degrees C. and total partial pressures of a TSA gas and a TEB gas in a process chamber of 3 Pa, 9 Pa and 30 Pa. Other processing conditions are conditions falling within the condition range described in the above embodiment and are common to the film formation evaluations B1 to B3.

Figure 7:
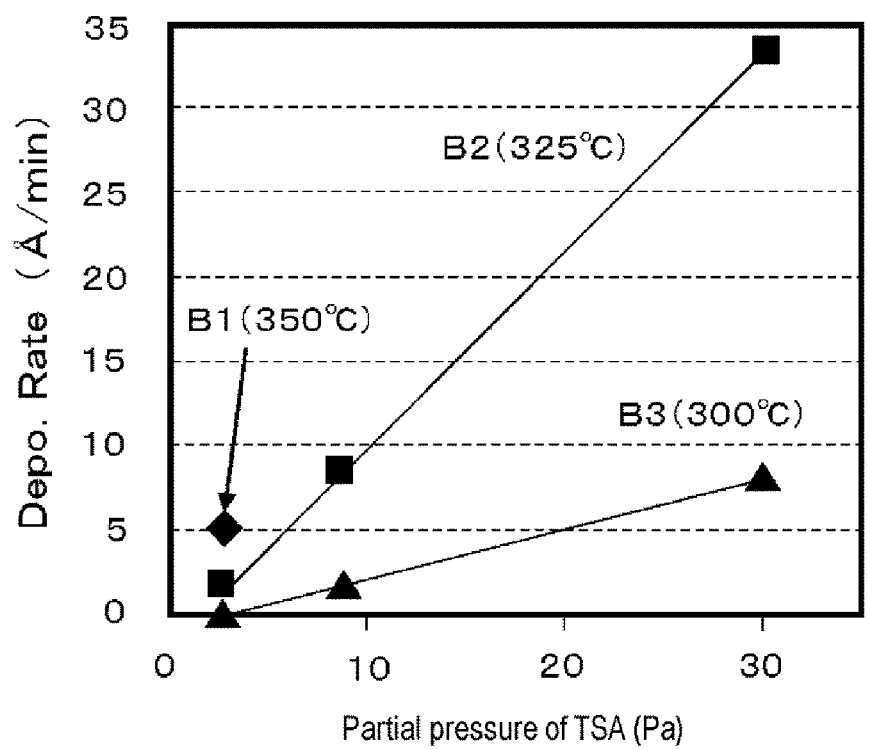
FIG. 7 is a view showing another evaluation result of a deposition rate.

Deposition rates in the film formation evaluations B1 to B3 were respectively evaluated. FIG. 7 is a diagram showing the evaluation result of the deposition rate. In FIG. 7, the horizontal axis represents the total partial pressure (Pa) of the TSA gas and the TEB gas, and the vertical axis represents the deposition rate (Å/min). In FIG. 7, ♦, ■ and ▲ indicate the film formation evaluations B1 to B3, respectively. According to FIG. 7, it can be seen that as the film-forming temperature increases and as the total partial pressure of the TSA gas and the TEB gas increases, the deposition rate becomes higher. Further, it can be seen that in the film formation evaluation B 1, a practical deposition rate can be obtained even when the total partial pressure of the TSA gas and the TEB gas is set to 3 Pa. Moreover, it can be seen that in the film formation evaluation B2, it is difficult to obtain a practical deposition rate when the total partial pressure of the TSA gas and the TEB gas is set to 3 Pa and it is possible to obtain a practical deposition rate by increasing the total partial pressure of the TSA gas and the TEB gas to 9 Pa. In addition, it can be seen that in the film formation evaluation B3, it is difficult to obtain a practical deposition rate when the total partial pressure of the TSA gas and the TEB gas is set to 9 Pa or lower and it is possible to obtain a practical deposition rate by increasing the total partial pressure of the TSA gas and the TEB gas to 30 Pa.

By simultaneously supplying the TSA gas and the TEB gas and properly adjusting the total partial pressure of the TSA gas and the TEB gas in the process chamber as described above, it is possible to perform the film-forming process at a practical deposition rate in a low temperature region of 350 degrees C. or lower, for example, a temperature condition of 325 degrees C. or 300 degrees C. The present inventors have found that by appropriately adjusting the total partial pressure of the TSA gas and the TEB gas in the process chamber, it is possible to perform a film-forming process at a practical deposition rate even in a lower temperature region of 300 degrees C. or lower, for example, under a temperature condition of 250 degrees C. or lower.

Example 3

Film formation evaluations C1 to C8 were respectively carried out using the substrate processing apparatus according to the above-described embodiment. In the film formation evaluations C1 to C4, a film-forming process according to the film-forming sequence shown in FIG. 4A was performed. In the film formation evaluations C5 to C7, a film-forming process according to the film-forming sequence shown in FIG. 4D was performed. In the film formation evaluation C8, a film-forming process according to a film-forming sequence in which a TSA gas, a TEB gas and an NH₃ gas are simultaneously supplied to a wafer was performed. The film-forming temperature (degrees C.), the film-forming pressure (Pa) and the supply flow rates (sccm) of the TSA gas, the DS gas, the TEB gas and the NH₃ gas in the film formation evaluations C1 to C8 were set to the conditions falling within the processing condition range shown in FIG. 8A. Other processing conditions are conditions falling within the condition range described in the above embodiment and are common to the film formation evaluations C1 to C8.

Figure 8B:
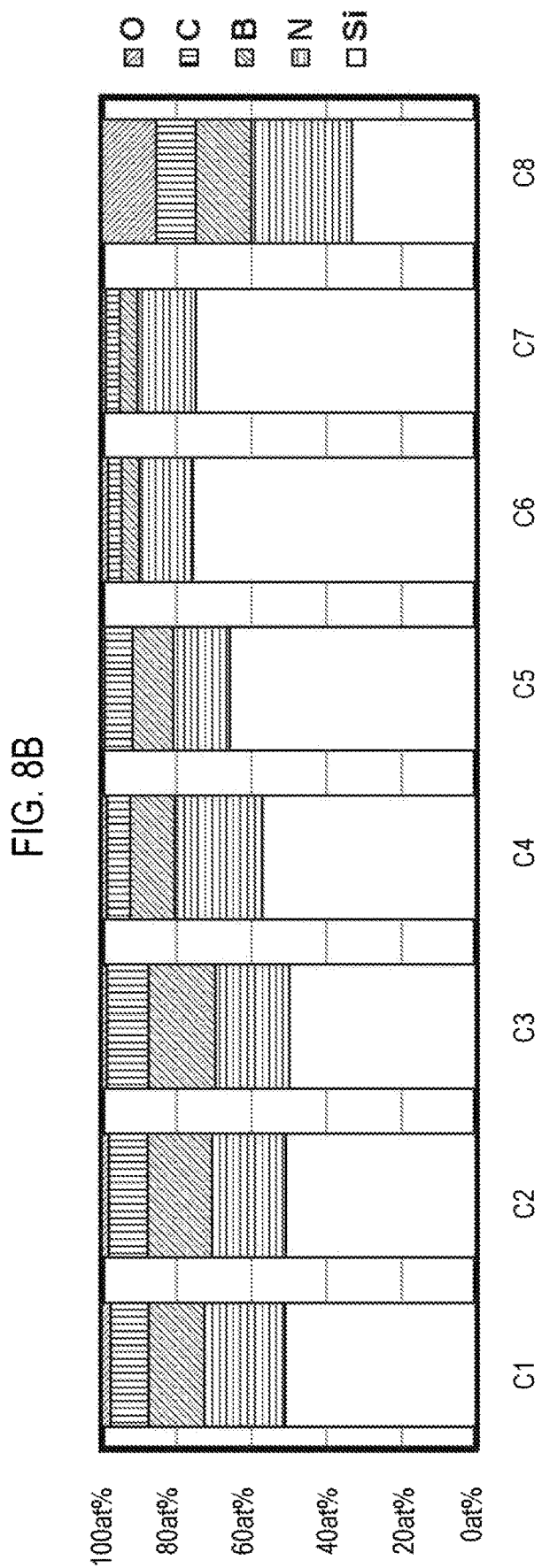
FIG. 8B is a diagram showing the composition of a formed film.

The composition of each of the films formed in the film formation evaluations C1 to C8 (hereinafter referred to as films C1 to C8, respectively) was measured by XPS (X-ray photoelectron spectroscopy). The results are shown in FIG. 8B. In FIG. 8B, the horizontal axis represents the films C1 to C8, and the vertical axis represents the proportion (at %) of each of the elements (Si, B, N, C or the like) contained in these films.

According to FIG. 8B, it can be seen that the compositions of the films C1 to C3 are substantially the same. That is, it can be noted that when the supply flow rates of the TSA gas and the TEB gas are about the same, the composition of the film hardly changes even if the processing conditions such as the film-forming temperature, the film-forming pressure and the like are made different.

Furthermore, it is understood that the Si concentration in the film C4 is higher than the Si concentration in the films C1 to C3. That is, it can be seen that by increasing the ratio of the supply flow rate of the TSA gas to the supply flow rate of the TEB gas, it is possible to control the Si concentration in the film formed on the wafer in an increasing direction.

From these facts, it can be understood that the composition of the film is determined mainly by the supply flow rates of the TSA gas and the TEB gas rather than the film-forming temperature and the film-forming pressure.

Moreover, it can be noted that the Si concentrations in the films C5 to C7 are higher than the Si concentrations in the films C1 to C4. From this, it can be seen that by using both the TSA gas and the DS gas as the precursor, namely by adding the DS gas to the TSA gas and the TEB gas when simultaneously supplying the TSA gas and the TEB gas, it is possible to control the Si concentration in the film formed on the substrate in an increasing direction. Further, it can be understood that the Si concentrations in the films C6 and C7 are higher than the Si concentration in the film C5. From this, it can be understood that by increasing the supply flow rate of the DS gas when the TSA gas and the DS gas are used as the precursor, namely by further adding the DS gas to the TSA gas and the TEB gas and increasing the supply flow rate of the DS gas when the TSA gas and the TEB gas are simultaneously supplied, it is possible to control the Si concentration in the film formed on the wafer in an increasing direction.

In addition, it can be understood that 15 at % or larger of O is taken into the film C8 and the Si concentration therein is lowered. This is probably because the N—H bond contained in the $NH_3$ gas is taken into the film C8 and, hence, the oxidation resistance of the film C8 is lowered. That is, it is considered that the film C8 was oxidized when the wafer after the film-forming process is unloaded to the atmosphere.

It was confirmed that each of the films C1 to C8 is lower in extinction coefficient than the Si film not containing N, for example, the Si film formed by performing a film-forming sequence in which $BCl_3$ and $SiH_4$ are simultaneously supplied to a wafer.

In this way, by appropriately adjusting the supply flow rates of the TSA gas and the TEB gas, further adding the DS gas to the TSA gas and the TEB gas, or appropriately adjusting the supply flow rate of the DS gas, it is possible to make the Si film formed on the wafer rich in Si, to properly lower the B concentration or the C concentration in the film, or to appropriately increase the N concentration in the film. In addition, as described above, the composition of the Si film is not easily influenced by the film-forming temperature or the film-forming pressure. Therefore, these conditions can be set over a wide range (freely). As a result, the inter-plane uniformity or in-plane uniformity of the film composition and the film thickness can be improved with ease.

According to the present disclosure in some embodiments, it is possible to improve the controllability of a composition ratio of a film formed on a substrate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
   forming a film on the substrate by performing a cycle that includes:
   supplying a first precursor to the substrate in a process chamber, the first precursor being a substance represented by a structural formula of $Si_nC_mH_{2n+2m+2}$ or $Si_nC_mH_{2n+2m}$ where n is a positive integer and m is a positive integer, and not containing a chemical bond of nitrogen and hydrogen;
   supplying a second precursor to the substrate in the process chamber, the second precursor differing in molecular structure from the first precursor, being a substance represented by a structural formula of $Si_jH_{2j+2}$ where j is a positive integer, and not containing the chemical bond of nitrogen and hydrogen; and
   supplying a pseudo catalyst to the substrate in the process chamber, the pseudo catalyst being a substance represented by a structural formula of $YZ_3$ where Y is a Group 13 element and Z is a functional group selected from the group of hydrogen, a halogen group, an alkyl group, an amino group, an alkoxy group, and a hydroxy group, and not containing the chemical bond of nitrogen and hydrogen,
   wherein in the act of forming the film, a substance containing the chemical bond of nitrogen and hydrogen is not supplied to the substrate,
   wherein in the act of supplying the first precursor, a temperature of the substrate is set to a first temperature at which the first precursor is not pyrolized when the first precursor exists alone,
   wherein in the act of supplying the second precursor, a temperature of the substrate is set to a second temperature at which the second precursor is not pyrolized when the second precursor exists alone,
   wherein in each cycle, the act of supplying the first precursor and the act of supplying the pseudo catalyst are alternately performed,
   wherein in each cycle, one among the first precursor and the pseudo catalyst, which has been supplied earlier than the other one among the first precursor and the pseudo catalyst, is contained in the process chamber without being removed from the process chamber until the other one is supplied, and
   wherein in each cycle, the other one among the first precursor and the pseudo catalyst, which has been supplied later, reacts with the one among the first precursor and the pseudo catalyst, which has been supplied earlier, to decompose a part of the pseudo catalyst.

2. The method according to claim 1, wherein the pseudo catalyst contains boron or aluminum as the Group 13 element.

3. The method according to claim 1, wherein in the act of forming the film, a pressure in a space in which the substrate exists is set to 1 Pa or higher and 600 Pa or lower.

4. A method of manufacturing a semiconductor device, comprising:
   forming a film on a substrate for manufacturing the semiconductor device by performing a cycle that includes:

supplying a first precursor to the substrate in a process chamber, the first precursor being a substance represented by a structural formula of $Si_nC_mH_{2n+2m+2}$ or $Si_nC_mH_{2n+2m}$ where n is a positive integer and m is a positive integer, and not containing a chemical bond of nitrogen and hydrogen;

supplying a second precursor to the substrate in the process chamber, the second precursor differing in molecular structure from the first precursor, being a substance represented by a structural formula of $Si_jH_{2j+2}$ where j is a positive integer, and not containing the chemical bond of nitrogen and hydrogen; and supplying a pseudo catalyst to the substrate in the process chamber, the pseudo catalyst being a substance represented by a structural formula of $YZ_3$ where Y is a Group 13 element and Z is a functional group selected from the group of hydrogen, a halogen group, an alkyl group, an amino group, an alkoxy group, and a hydroxy group, and not containing the chemical bond of nitrogen and hydrogen, wherein in the act of forming the film, a substance containing the chemical bond of nitrogen and hydrogen is not supplied to the substrate, wherein in the act of supplying the first precursor, a temperature of the substrate is set to a first temperature at which the first precursor is not pyrolized when the first precursor exists alone, wherein in the act of supplying the second precursor, a temperature of the substrate is set to a second temperature at which the second precursor is not pyrolized when the second precursor exists alone, wherein in each cycle, the act of supplying the first precursor and the act of supplying the pseudo catalyst are alternately performed, wherein in each cycle, one among the first precursor and the pseudo catalyst, which has been supplied earlier than the other one among the first precursor and the pseudo catalyst, is contained in the process chamber without being removed from the process chamber until the other one is supplied, and wherein in each cycle, the other one among the first precursor and the pseudo catalyst, which has been supplied later, reacts with the one among the first precursor and the pseudo catalyst, which has been supplied earlier, to decompose a part of the pseudo catalyst.

5. The method according to claim 1, wherein the second precursor includes a disilane or silicon hydride having a higher order than the disilane.

6. The method according to claim 1, wherein in the act of supplying the pseudo catalyst, a temperature of the substrate is set to a temperature at which the pseudo catalyst is not pyrolized when the pseudo catalyst exists alone.

7. The method according to claim 1, wherein the first precursor includes a substance acting as a Lewis base in the act of forming the film, and wherein the pseudo catalyst includes a substance acting as a Lewis acid, which acts on the substance acting as the Lewis base included in the first precursor to extract protons from the chemical bond of silicon and hydrogen contained in the first precursor, in the act of forming the film.

8. The method according to claim 1, wherein in the act of forming the film, the temperature of the substrate is set to 150 degrees C. or higher and 400 degrees C. or lower.

* * * * *